United States Patent
Moriya et al.

(10) Patent No.: US 7,317,407 B2
(45) Date of Patent: Jan. 8, 2008

(54) FLOATING POINT SIGNAL REVERSIBLE ENCODING METHOD, DECODING METHOD, DEVICE THEREOF, PROGRAM, AND RECORDING MEDIUM THEREOF

(75) Inventors: Takehiro Moriya, Nerima-ku (JP); Dai Yang, San Diego, CA (US); Noboru Harada, Nerima-ku (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 11/679,663

(22) Filed: Feb. 27, 2007

(65) Prior Publication Data

US 2007/0139235 A1 Jun. 21, 2007

Related U.S. Application Data

(62) Division of application No. 10/558,710, filed as application No. PCT/JP2004/012646 on Sep. 1, 2004, now Pat. No. 7,209,056.

(30) Foreign Application Priority Data

Sep. 2, 2003 (JP) .............................. 2003-310106

(51) Int. Cl.
*H03M 7/38* (2006.01)
(52) U.S. Cl. .......................................... 341/51; 341/50
(58) Field of Classification Search .................. 341/51, 341/50
See application file for complete search history.

(56) References Cited

U.S. PATENT DOCUMENTS 6,240,431 B1 5/2001 Dyer et al.

(Continued)

FOREIGN PATENT DOCUMENTS

JP 2001-44847 2/2001

(Continued)

OTHER PUBLICATIONS

Moriya, Takehiro et al., "Onkyo Shingo no Sampling Rate Scalable Lossless Fugoka", Joho Kagaku Gijutsu Forum Ippan Koen Ronbunshu, Separate vol. 2, pp. 227 to 228, 2002. (with English Translation), Sep. 2003.

(Continued)

*Primary Examiner*—Rexford Barnie
*Assistant Examiner*—Joseph Lauture
(74) *Attorney, Agent, or Firm*—Oblon, Spivak, McClelland, Maier & Neustadt, P.C.

(57) ABSTRACT

The average amplitude of the samples in a signal sample sequence X in a floating-point format is determined for each frame. If the average amplitude is greater than a predetermined value, an integer formatting part 12 converts the sequence X into a signal sample sequence Y in a 16-bit integer format by truncation, a compressing part 13 codes the sequence Y to output a code sequence Ca, a difference producing part 14 produces a difference signal Z that corresponds to the difference between the signal sample sequence X and a sequence Y' in the floating-point format converted from the sequence Y, and a compressing part 17performs entropy coding on the least significant (23−n) bits of a mantissa M of the difference signal Z, which is determined by the number of bits n following the most significant "1" in each sample in the sequence Y, and outputs a code sequence Cb. If the average amplitude is not greater than the predetermined value, the sequence X is directly losslessly coded by a compressing part 121. A code Cd, which indicates which coding is selected, is output.

17 Claims, 30 Drawing Sheets

U.S. PATENT DOCUMENTS

| | | | |
|---|---|---|---|
| 6,396,420 B1 | 5/2002 | Augustine | |
| 6,633,679 B1 * | 10/2003 | Yfantis | 382/240 |
| 2005/0091051 A1 | 4/2005 | Moriya et al. | |

FOREIGN PATENT DOCUMENTS

| | | |
|---|---|---|
| JP | 2003-332914 | 11/2003 |
| WO | 2003/077425 | 9/2003 |

OTHER PUBLICATIONS

Jin, Akio, et al., A Hierarchical Lossless/Lossy Coding System for High Quality Audio up to 192 KHz Sampling 24 Bit Format. IEEE Transactions on Consumer Electronics, vol. 49, No. 3, pp. 759 to 764, 2003.

Hans, Mat et al., "Lossless Compression of Digital Audio", IEEE Signal Processing Magazine, pp. 21-32, Jul. 2001.

Vadim Engelson, et al., "Lossless Compression of High-Volume Numerical Data From Simulations", Data Compression Conference, XP010377421, Mar. 28, 2000, p. 574.

Vadim Engelson, et al., "Lossless Compression of High-Volume Numerical Data From Simulations", International Citation, [Online]., XP002402962, Mar. 23, 2003, pp. 1-13.

Aaron Trott, et al., "Wavelets Applied to Lossless Compression and Progressive Transmission of Floating Point Datat in 3-D Curvilinear Grids", Visualization Conference, XP000704217 Oct. 27, 1996, pp. 385-388.

Brendt Wohlberg, et al., JPEG2000 Part 10: Floating Point Coding, Joint Photographic Expert Group, XP017206116, Jul. 18, 2002, The whole document.

Bryan E. Usevitch, "JPEG2000 Extensions for Bit Plane Coding of Floating Point Data", Data Compression Conference, XP 002402963, Mar. 25, 2003, p. 451.

* cited by examiner

FIG. 4

| n | ABSOLUTE VALUE OF INTEGER VALUE $X_W$ | 23-BIT MANTISSA M |
|---|---|---|
| -127 | 0 | $0._{P_D} X_{23}\ X_{22}\ \ldots\ldots\ X_1$ |
| 0 | 1 | $1._{P_D} X_{23}\ X_{22}\ \ldots\ldots\ X_1$ |
| 1 | 2 to 3 | $\underbrace{1\ X_{23}}_{2\text{ BITS}} \cdot X_{22}\ \ldots\ldots\ X_1$ |
| 2 | 4 to 7 | $\underbrace{1\ X_{23}\ X_{22}}_{3\text{ BITS}} \cdot X_{21}\ \ldots\ldots\ X_1$ |
| k-1 | $2^{k-1}$ to $(2^k-1)$ | $\underbrace{1\ X_{23}\ X_{22}\ \ldots\ X_{23-(k-2)}}_{K\text{ BITS}} \cdot X_{23-(k-1)}\ \cdots\ X_1$ |
| 22 | $2^{22}$ to $(2^{23}-1)$ | $\underbrace{1\ X_{23}\ \ldots\ldots\ X_2}_{23\text{ BITS}} \cdot X_1$ |

FIG. 5

| ABSOLUTE VALUE OF INTEGER VALUE $X_W$ | SIGN S AND EXPONENT E | MANTISSA M |
|---|---|---|
| 0 | NO CONSTRAINT | NO CONSTRAINT |
| 1 | 0 | NO CONSTRAINT |
| 2 to 3 | 0 | MOST SIGNIFICANT ONE BIT: 0 |
| 4 to 7 | 0 | MOST SIGNIFICANT TWO BITS: 0 |
| – | – | – |
| $2^{k-1}$ to $(2^k-1)$ | 0 | MOST SIGNIFICANT k-1 BITS: 0 |
| $2^{22}$ to $(2^{23}-1)$ | 0 | MOST SIGNIFICANT 22 BITS: 0 |

FIG. 15A $n$
14 $2^{14} \leq X_W < 2^{15}$

3 $2^3 \leq X_W < 2^4$
2 $4 \leq X_W < 7$
1 $2 \leq X_W < 3$
0 $X_W = 1$

FIG. 15B $n$
14 $2^{14} \leq X_W < 2^{15}$

3 $2^3 \leq X_W < 2^4$
2 $4 \leq X_W < 7$
1 $2 \leq X_W < 3$
0 $X_W = 1$

FIG. 18

| SAMPLE NUMBER i | INTEGER VALUE | REQUIRED NUMBER OF DIGITS h |
|---|---|---|
| 0 | 90 | 23-6=17 |
| 1 | 300 | 23-8=15 |
| 2 | 43 | 23-5=18 |
| 3 | 65 | 23-6=17 |
| 4 | 3 | 23-1=22 |
| 5 | 5 | 23-2=21 |
| ... i ... | ... | |
| 1023 | 8 | 23-3=20 |

| SAMPLE NUMBER i | INTEGER VALUE | REQUIRED NUMBER OF DIGITS h |
|---|---|---|
| 0 | 90 | 23-6=17 |
| 1 | 300 | 23-8=15 |
| 2 | 43 | 23-5=18 |
| 3 | 65 | 23-6=17 |
| 4 | 3 | 23-1=22 |
| 5 | 5 | 23-2=21 |
| ... | ... | |
| ... | ... | |
| 1023 | 8 | 23-3=20 |

FIG. 22

| SAMPLE NUMBER i | INTEGER VALUE | REQUIRED NUMBER OF DIGITS h |
|---|---|---|
| 0 | 90 | 23-6=17 |
| 1 | 300 | 23-8=15 |
| 2 | 43 | 23-5=18 |
| 3 | 65 | 23-6=17 |
| 4 | 3 | 23-1=22 |
| 5 | 5 | 23-2=21 |
| ... | ... | |
| ... | ... | |
| 1023 | 8 | 23-3=20 |

FIG. 23

| SAMPLE NUMBER i | INTEGER VALUE | REQUIRED NUMBER OF DIGITS h | FRACTIONAL PART OF MANTISSA |
|---|---|---|---|
| 0 | 90 | 23-6=17 | |
| 1 | 300 | 23-8=15 | |
| 2 | 43 | 23-5=18 | |
| 3 | 0 | 32* | |
| 4 | 3 | 23-1=22 | |
| 5 | 5 | 23-2=21 | |
| ... | ... | | |
| 1023 | 8 | 23-3=20 | |

$E_0\ E_1\ E_2\ E_3 \cdots E_i \cdots E_{16}\ E_{17}\ E_{18}\ E_{19}\ E_{20}\ E_{21}$

*SEPARATELY

FIG. 24

| SAMPLE NUMBER i | INTEGER VALUE | REQUIRED NUMBER OF DIGITS h |
|---|---|---|
| 0 | 90 | 23-6=17 |
| 1 | 300 | 23-8=15 |
| 2 | 43 | 23-5=18 |
| 3 | 65 | 23-6=17 |
| 4 | 3 | 23-1=22 |
| 5 | 5 | 23-2=21 |
| ... | ... | |
| 1023 | 8 | 23-3=20 |

# FLOATING POINT SIGNAL REVERSIBLE ENCODING METHOD, DECODING METHOD, DEVICE THEREOF, PROGRAM, AND RECORDING MEDIUM THEREOF

CROSS-REFERENCE TO RELATED APPLICATIONS

This application is a Divisional of and claims the benefit of priority under 35 U.S.C. §120 from U.S. Ser. No. 10/558,710, filed Nov. 29, 2005 now U.S. Pat. No. 7,209,056, and claims the benefit of priority under 35 U.S.C. § 120 from PCT application JP04/12646, filed Sep. 1, 2004, and claims the benefit of priority under 35 U.S.C. § 119 from Japanese Patent Application priority document 2003-310106, filed in Japan on Sep. 2, 2003.

TECHNICAL FIELD

The present invention relates to a coding method for compressing a floating-point signal sample sequence carrying sound, music or image information into a code of smaller information quantity without distortion, a corresponding decoding method, a coding apparatus therefor, a decoding apparatus therefor, and programs therefor and a recording medium therefor.

BACKGROUND ART

As a method for compressing sound or image information, there is known a lossless coding method that involves no distortion.

Highly compressive lossless data compression can be achieved by combining a highly compressive lossy coding and a lossless compression of the difference between a reproduced signal of the lossy coding and the original signal. Such a combined compression method has been proposed in the patent literature 1. The method, which is described in detail in the patent literature, will be described briefly below.

In a coder, a frame forming part successively separates digital input signals (referred to also as an input signal sample sequence) into frames, each of which is composed of 1024 input signal samples, for example, and the digital signals are lossily compression-coded on the frame basis. This coding can be based on any format that is suitable for the input digital signal and can reproduce the original digital input signal with a certain fidelity by decoding.

For example, if the digital input signal is a sound signal, a speech coding recommended according to ITU-recommendation G.729 can be used. If the digital input signal is a music signal, a transform-domain weighted interleaved vector quantization (Twin VQ) coding used in MPEG-4 can be used. The code resulting from the lossy compression coding is locally decoded, and a difference signal that represents the difference between the locally decoded signal and the original digital signal is produced. Actually, however, there is no need of local decoding and, instead, it would suffice to obtain the difference between the original digital signal and a quantized signal resulting during the lossy compression coding. The amplitude of the difference signal is typically much smaller than that of the original digital signal. Thus, the quantity of information can be reduced by the lossless compression coding of the difference signal, compared with the lossless compression coding of the original digital signal.

To enhance the efficiency of the lossless compression coding, for a sequence of all the samples of the difference signal in a frame each expressed by sign and magnitude notation (a binary number of sign and magnitude), bits of each position, that is, bits of each of the MSB, the second MSB, . . . , and the LSB are linked along the sample sequence (that is, the time series) to form a respective bit sequence. In other words, the bit arrangement is transformed. For convenience, the bit sequence composed of linked 1024 bits at the equal bit position is referred to as a "coordinate bit sequence". On the other hand, a one-word bit sequence representing the amplitude value of each sample including its sign is referred to as an "amplitude bit sequence", for convenience. The difference signal has a small amplitude, and therefore, the most significant bit is, or the most significant bit and the following plural bits are, often all "0". Thus, by representing the coordinate bit sequence formed by linking the bits at such a bit position, the efficiency of the lossless compression coding of the difference signal can be enhanced.

The coordinate bit sequence is losslessly compression-coded. As the lossless compression coding, an entropy coding, such as Huffman coding and arithmetic coding, can be used which takes advantage of the occurrence or frequent occurrence of a sequence in which the same sign (1 or 0) successively appears.

When decoding, the code resulting from the lossless compression coding is decoded, and the inverse transformation of bit arrangement is performed on the decoded signal. That is, the coordinate bit sequences are transformed into the amplitude bit sequences for each frame, and the resulting difference signals are reproduced sequentially. In addition, the code resulting from the lossy compression coding is decoded, the decoded signal and the reproduced difference signal are summed together, and then, the sum signals for each frame are linked together sequentially, thereby reproducing the original digital signal sequence.

Besides, there are known a variety of lossless coding methods for audio or visual information that permit no distortion. For example, a lossless coding method for music information is disclosed in the non-patent literature 1. Any conventional methods are such one that performs compression coding on a PCM signal directly derived from a signal waveform.

However, in music recording studios, a waveform is sometimes recorded and stored in the floating-point format. Any value in the floating-point format is separated into a sign, an exponent and a mantissa. For example, in the IEEE-754 standard floating-point format shown in FIG. 37, any value consists of 32 bits including 1 bit for sign, 8 bits for exponent and 23 bits for mantissa in the descending order of significance. Denoting the sign by S, the value represented by the 8 bits for exponent by a decimal number E and the binary number for mantissa by M, the value in the floating-point format can be represented in the sign and magnitude binary notation as follows.

$$(-1)^S \times 1.M \times 2^{E-E_0} \quad (1)$$

According to the IEEE-754 standard, $E_0$ is defined as $E_0 = 2^7 - 1 = 127$, so that the "$E-E_0$" in the expression (1) can be any value falling within the range:

$$-127 \leq E - E_0 \leq 128.$$

Here, it is defined that all the bits are set at "0" when $E-E_0 = -127$, and all the bits are set at "1" when $E-E_0 = 128$. The term "$E-E_0 = n$" represents a value obtained by subtracting 1 from the number of digits (number of bits) of the integer part of the value represented by the formula (1), that is, the number of bits following the most significant "1".

In the case where sound, music or image information is represented by a digital signal sequence in the floating-point format, the bit sequence composed of "0"s and "1"s is likely to be random because of the characteristics of the floating-point format. Thus, even if the bit arrangement transformation described above is performed, the entropy compression coding or the like cannot be expected to provide a high compression ratio. Furthermore, the sample sequence in the floating-point format significantly differs from the original analog waveform, so that there is no redundancy resulting from correlation between samples. Therefore, even if the lossless predictive coding method disclosed in the non-patent literature 1 described above is applied, a higher compression ratio cannot be expected.

Patent literature 1: JP Application Kokai Publication No. 2001-44847

Non-patent literature 1: "Lossless Compression of Digital Audio" by Mat Hans, Ronald W. Schafer et al., IEEE SIGNAL PROCESSING MAGAZINE, JULY 2001, pp. 21-32

DISCLOSURE OF THE INVENTION

Problem to be Solved by the Invention

An object of the present invention is to provide a lossless coding method and a lossless decoding method for a signal sample sequence in a floating-point format, apparatus therefor, programs therefor, and a recording medium therefor.

Means to Solve Problem

A lossless coding method for a signal in a floating-point format according to a first aspect of the present invention comprises:

(a) a step of converting a first signal sample sequence in the floating-point format into a second signal sample sequence in an integer format;

(b) a step of losslessly compressing the second signal sample sequence in the integer format to produce a first code sequence;

(c) a step of producing a difference signal in the floating-point format that corresponds to the difference between the second signal sample sequence in the integer format and the first signal sample sequence in the floating-point format;

(d) a step of determining which coding processing is of higher compression efficiency, a first coding processing that codes a range of bits capable of assuming non-zero in a sample of the difference signal in the floating-point format, the range of bits being determined by the bit position of the most significant "1" in the corresponding sample in the second signal sample sequence in the integer format, or a second coding processing that directly codes the difference signal; and (e) a step of coding the difference signal by the first coding processing to produce a second code sequence if the result of the determination indicates the first coding processing, or coding the difference signal by the second coding processing to produce a second code sequence if the result of the determination indicates the second coding processing.

A lossless coding method for a signal in a floating-point format according to a second aspect of the present invention comprises:

(a) a step of determining which compression is of higher compression efficiency, a direct compression of a first signal sample sequence in the floating-point format on a frame basis or a dual-signal separate compression of an integer-value sample sequence and a difference signal derived from the first signal sample sequence;

(b) a step of performing the dual-signal separate compression if the result of the determination indicates the dual-signal separate compression, the step (b) comprising:

(b-1) a step of converting the first signal sample sequence into a second signal sample sequence in an integer format;

(b-2) a step of losslessly compressing the second signal sample sequence in the integer format to produce a first code sequence;

(b-3) a step of producing a difference signal in the floating-point format that corresponds to the difference between the second signal sample sequence in the integer format and the first signal sample sequence in the floating-point format; and (b-4) a step of producing a second code sequence from the difference signal in the floating-point format; or (c) a step of directly losslessly compressing the first signal sample sequence to produce a third code sequence if the result of the determination indicates the direct compression; and (d) a step of producing an auxiliary code that indicates whether the direct lossless compression or the separate compression of two types of signals is performed.

Effects of the Invention

According to the first aspect of the present invention, if the average amplitude of the input signal sample sequence X in the floating-point format is greater than a predetermined value, the signal sample sequence X is directly losslessly coded, and if the average amplitude is equal to or smaller than the predetermined value, the input signal sample sequence X is separated into an integer-value sample sequence and a difference signal, and the integer-value sample sequence and the difference signal are coded separately. Thus, the coding efficiency can be improved.

According to the second aspect of the present invention, in the case where the input signal sample sequence X in the floating-point format is separated into the integer-value sample sequence Y and the difference signal Z, which are separately coded, a case in which only the bits capable of assuming non-zero in the difference signal are coded and a case in which the difference signal is directly coded are compared in terms of compression efficiency, and one of the codes which is of higher compression efficiency is adopted. Thus, the coding efficiency can be further improved.

BRIEF DESCRIPTION OF THE DRAWINGS

FIG. 4 shows a correspondence between the absolute value of an integer value and the bit sequence of a mantissa that represents the integer value;

FIG. 5 shows a relationship between the absolute value of an integer value, the sign, the exponent and the mantissa of a digital difference signal;

FIG. 15A is a diagram showing a range of bits of a mantissa that can be non-zero in the case shown in FIG. 9A;

FIG. 15B is a diagram showing a range of bits of a mantissa that can be non-zero in the case shown in FIG. 9B;

FIG. 18 is a diagram for illustrating a process of coding a mantissa by scanning the bits thereof in the time-axis direction;

FIG. 21 is a diagram for illustrating another way of scanning bits in the time-axis direction;

FIG. 22 is a diagram for illustrating another way of scanning bits in the time-axis direction;

FIG. 23 is a diagram for illustrating another way of scanning bits in the time-axis direction;

FIG. 24 is a diagram for illustrating a way of scanning bits in the time-axis direction with the LSBs of bit sequences, each composed of bits capable of assuming non-zero, aligned with each other;

BEST MODES FOR CARRYING OUT THE INVENTION

While the present invention can be applied also to an image signal, a sound signal or the like, the following description will be made mainly with regard to embodiments in which the present invention is applied to a music signal. In addition, while various kinds of floating-point formats can be used, the following description will be made on the assumption that the 32-bit floating-point format according to the IEEE-754 standard is used.

First Embodiment

Figure 1:
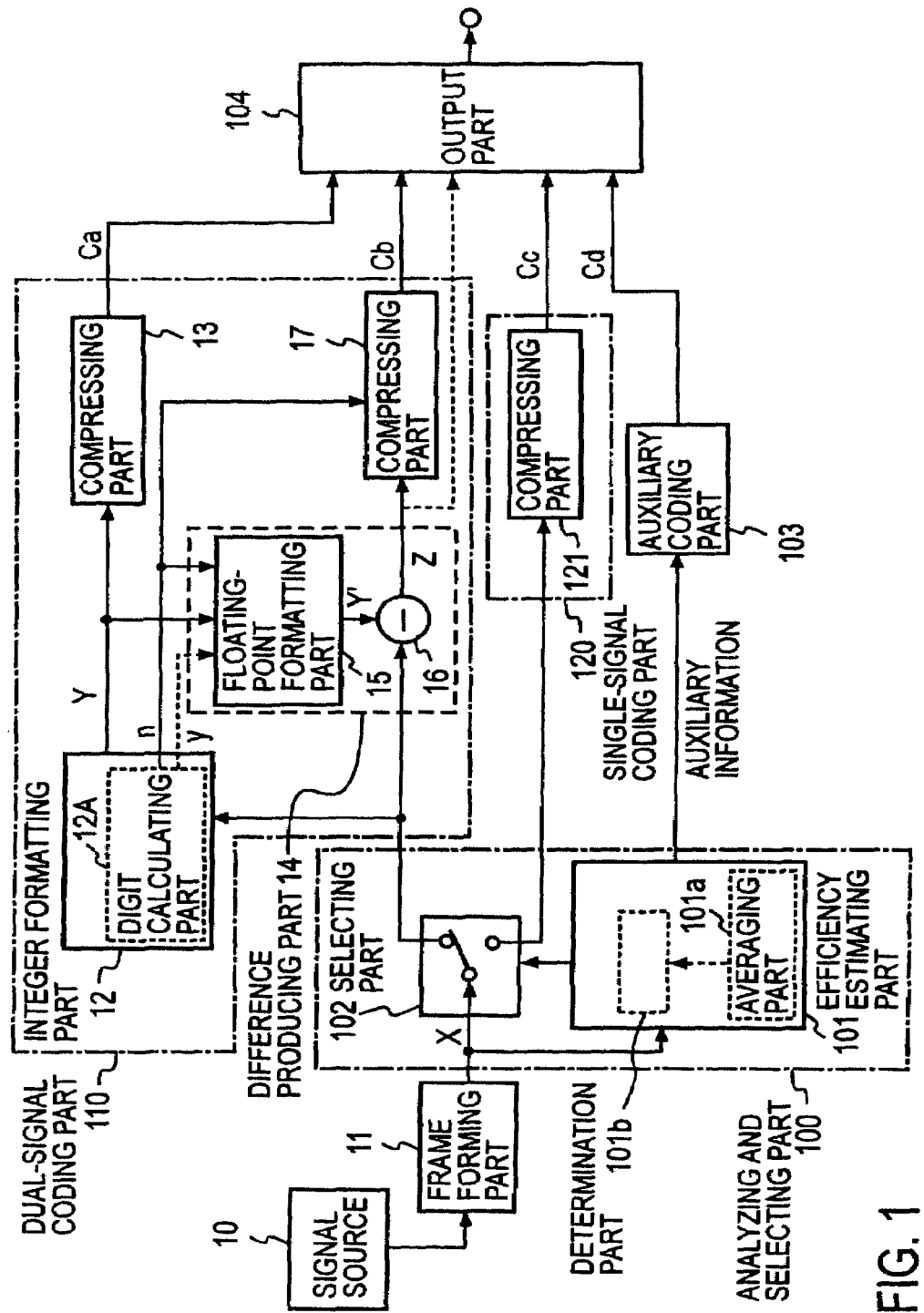
FIG. 1 is a functional diagram of a coder according to a first embodiment of the present invention.

FIG. 1 shows a functional configuration of a coder according to an embodiment of the present invention. A coder according to this embodiment comprises an analyzing and selecting part 100, a single-signal coding part 120, a dual-signal coding part 110, an auxiliary coding part 103 and an output part 104. The analyzing and selecting part 100 comprises an efficiency estimating part 101 and a selecting part 102. The dual-signal coding part 110 comprises an integer formatting part 12, compressing parts 13 and 17, and a difference producing part 14.

For example, a signal source 10 outputs a music signal sample sequence in the form of a sequence of input digital signal samples X in the 32-bit floating-point format. The input signal sample sequence X is produced by performing a processing, such as transformation, amplitude adjustment, effect addition and mixing, on a raw signal recorded in the 24-bit integer format and converting the resulting signal, which has a fractional part as a result of the processing, into the floating-point format, or produced by converting a raw signal recorded in the 24-bit integer format into the 32-bit floating-point format and performing such processing as described above on the resulting signal. The input signal sample sequence X is divided by a frame forming part 11 into frames, each of which contains a certain number of samples, for example, 1024 samples. The input signal sample sequence may be divided into super-frames each containing 16 to 32 frames, or each of the resulting frames may be subdivided into halves or into quarters. It is essential only that the input signal sample sequence is divided into a group of a certain number of samples, and such a group of samples will be generically referred to as a frame.

The input signal sample sequence X is analyzed by the analyzing and selecting part 100 and then passed to any one of the dual-signal coding part 110, which losslessly compression-codes an integer value and an error thereof separately, and the single-signal coding part 120, which directly losslessly compression-codes the input signal sample sequence X. In the analyzing and selecting part 100, for example, the input signal sample sequence X is input to the efficiency estimating part 101, where an averaging part 101a calculates the average amplitude for the relevant frame, and a determination part 101b determines whether or not the average amplitude is equal to or greater than a predetermined value, and the selecting part 102 is controlled based on the result of the determination. If the average amplitude is determined as being equal to or greater than the predetermined value, the input signal sample sequence X of the frame is supplied to the dual-signal coding part 110, or if the average amplitude is determined as being smaller than the predetermined value, the input signal sample sequence X of the frame is supplied to the single-signal coding part 120.

For example, if the integer part of each sample in the input signal sample sequence X is represented by a 16-bit binary number, the predetermined value used as a criterion for the determination in the determination part 101b is a 8-bit value. The predetermined value varies with the integer value described above, and is selected based on the characteristics of the input signal sample sequence so that the entire compression efficiency is improved.

In the dual-signal coding part 110, the signal sample sequence X in the floating-point format is input to the integer formatting part 12 and converted into a signal sample sequence Y in the integer format on a sample basis. As described above, in the example described above, the digital signal sample X is often derived from a raw signal in the 24-bit integer format through a processing, such as transformation, amplitude adjustment and effect addition, so that the amplitude of the signal typically does not vary significantly. Thus, the integer formatting part 12 can convert the signal sample sequence X into the integer format simply by rounding, truncating or rounding up the fractional part.

Figure 2:
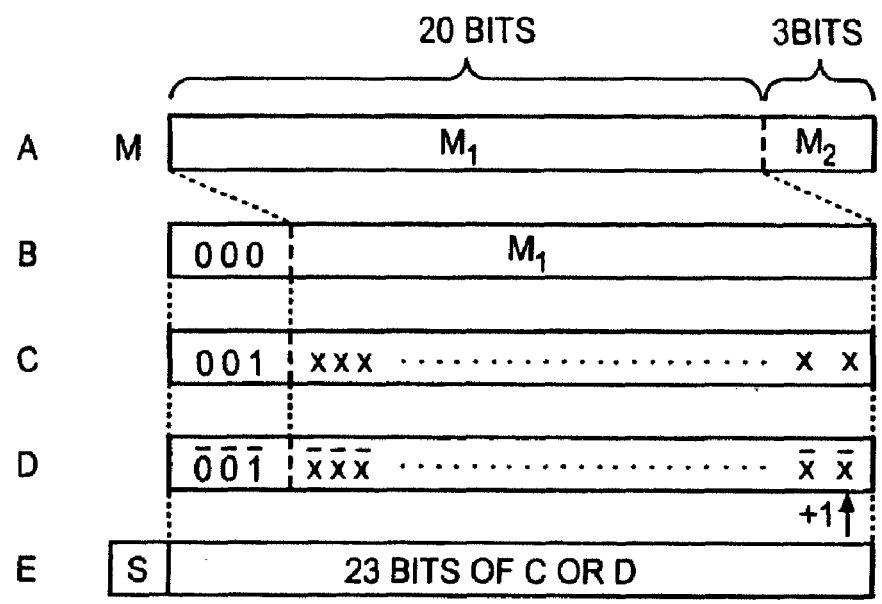
FIG. 2 is a diagram for illustrating an operation of an integer formatting part 12 shown in FIG. 2.

As an example, truncation will be described with reference to FIG. 2. While the number of digits of the integer format may be 16 bits, 20 bits or the like, the following description will be made on the assumption that the 24-bit integer format is used.

To represent a waveform in the floating-point format, normalization may be performed so that an integer value of 32768 ($=2^{15}$) is normalized to 1.0, or an integer value of $2^{23}$ is normalized to 1.0. However, these cases differ from the case described below only in the value of the exponent but don't have an essential difference.

If the exponent value E is 147, for example, the bit adjacent the decimal point on its higher order side is the 20th (147−120=20) bit from the MSB in the mantissa. As shown in FIG. 2A, the most significant 20 bits ($M_1$) in the 23-bit mantissa M correspond to a part that follows the most significant "1" of the integer part in the sign and magnitude binary notation, and the remaining three least significant bits ($M_2$) in the mantissa M correspond to the fractional part below the decimal point. In the following, the part $M_1$ will be referred to as an integer part of the mantissa M. Therefore, as shown in FIG. 2B, if the mantissa M is shifted by three bits toward the least significant bit position so that the least significant bit in the integer part ($M_1$) of the mantissa is positioned at the least significant bit in the entire 23-bit mantissa, overflow of the three bits ($M_2$) below the decimal point occurs, and thus, the three bits are truncated. Then, the least significant bit in the most significant three bits having been made unoccupied by such shifting ("000" in this example) (that is, the 21st bit from the least significant bit) is set at 1, which corresponds to "1" of "1.M" in the expression (1), thereby providing a truncated integer value (see FIG. 3C). Alternatively, "1" may be added before the most significant bit in the 23 bits before shifting, and the resulting 24 bits may be shifted by three bits.

Furthermore, the resulting integer value is converted into a two's complement notation. That is, the sign bit S of each signal sample sequence X in the floating-point format is used as it is as the most significant bit, and as for the other 23 bits, if the sign S is "0" (positive), the 23 bits shown in FIG. 2C are used as they are, and if the sign S is "1" (negative), the 23 bits are logically inverted as shown in FIG. 2D, that is, the values "0" and "1" are interchanged, and then, "1" is added to the least significant bit. As the most significant bit, the sign bit S is used as it is. In this way, a signal sample sequence Y in the 24-bit integer format represented in the complement notation is obtained as shown in FIG. 2E.

The above description has been made generally on the assumption that the mantissa M contains 0 or more bits corresponding to the fractional part, and a 32-bit digital signal sample in the floating-point format is converted into a 24-bit digital signal sample in the integer format. However, for example, in the case where a plurality of raw signals in the 24-bit integer format are mixed for processing, one sample may have an amplitude value that is significantly greater than the maximum value that can be represented by 24 bits. In such a case where $E \geq 150$, as an exceptional processing, the value of the exponent E is fixed to 150 (E=127+23 =150) in the example described above, an exception signal y is provided to the difference producing part 14, and the most significant 23 bits of the "1M", which is the mantissa M with "1" added at the top thereof, is converted into the two's complement notation to produce a signal sample sequence Y in the 24-bit integer format.

Figure 3:
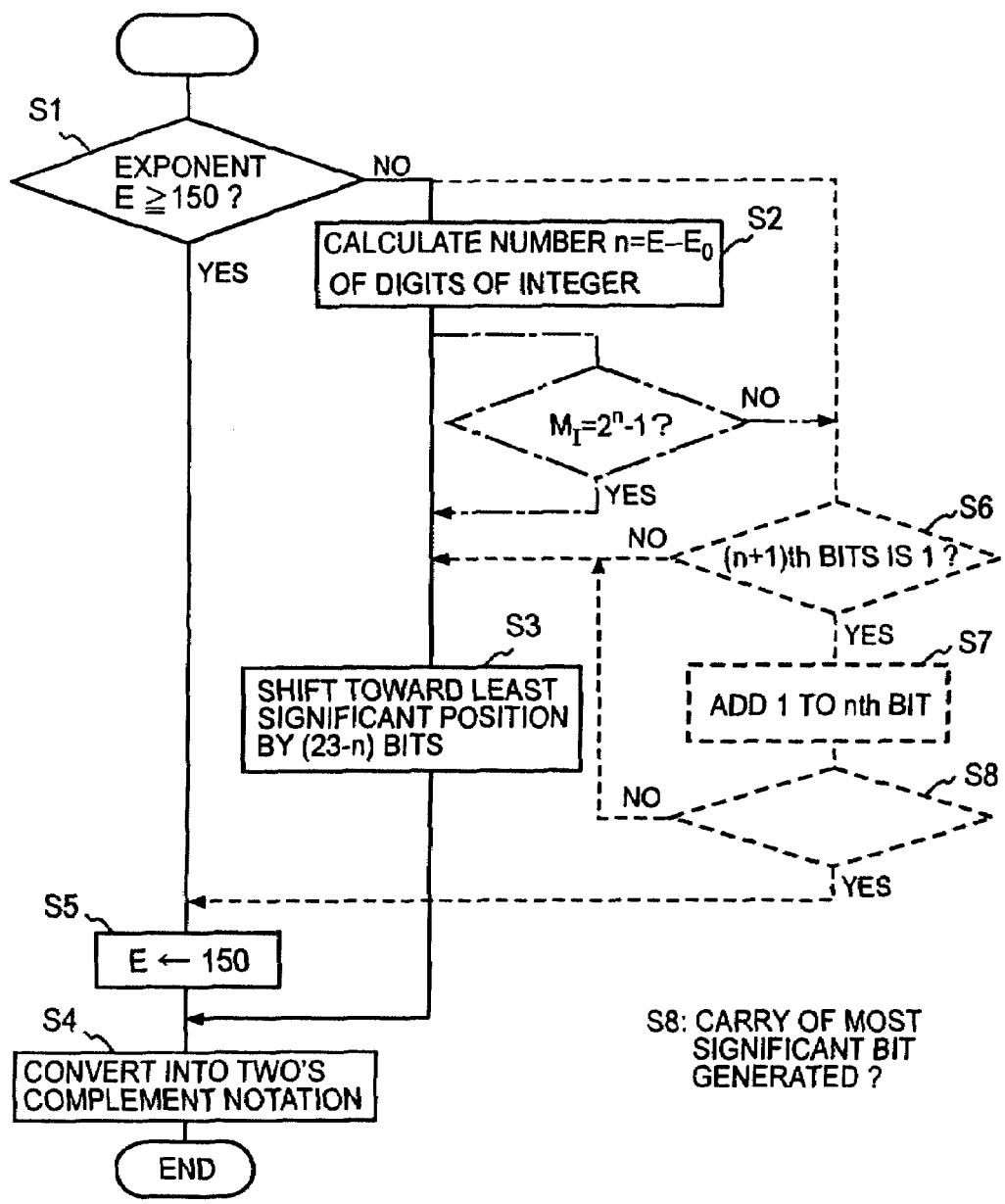
FIG. 3 is a flowchart showing a processing procedure performed in the integer formatting part 12 shown in FIG. 2.

The integer formatting part 12 performs a processing shown in FIG. 3, for example. First, it is checked if the exponent E is equal to or greater than 150, that is, whether the integer part is constituted by 23 or more bits or not (S1). If the integer part is constituted by less than 23 bits, the digit calculating part 12A determines the number of digits n (n=E−$E_0$) of the integer part of the mantissa and outputs the result (S2). Then, the mantissa M is shifted by (23−n) bits toward the least significant position to make overflow of the fractional part occur, and "1" is placed at the (n+1)th bit position viewed from the least significant bit of the resulting integer part composed of n bits (S3). Then, "0"s are placed at the remaining bit positions preceding the (n+1)th bit so that the whole mantissa is composed of 23 bits, and based on the sign bit S, the resulting 23 bits are converted into the 24-bit integer format represented in the two's complement notation, thereby producing a signal sample Y in the integer format (S4). Specifically, the sign bit S is used as the most significant bit as it is, and as for the remaining 23 bits, if the sign S is "0" (positive), the bits, from the least significant bit to the 23rd bit, of the integer part resulting from the shifting and the addition of "1" to the (n+1)th bit from the least significant bit in step S3 are used as they are, and if the sign S is "1" (negative), the bits, from the least significant bit to the 23rd bit, of the integer part resulting from the shift and the addition of "1" are inverted, and "1" is added to the least significant bit of the resulting 23 bits to provide a value in the complement notation. If the exponent E is equal to or greater than 150 in step S1, the exponent E is set at 150 in step S5, and then, a signal sample Y in the integer format is produced from the most significant 23 bits of the "1M" in step S4.

In the above description, the mantissa M is shifted by (23−n) bits to provide a 24-bit absolute value sample in the sign and magnitude binary notation. Alternatively, most significant n bits (n=E−E$_0$) of the mantissa M shown as M$_1$ in FIG. 2A may be extracted, "1" be added at the top of the n bits to make the number of bits (n+1) as shown in FIG. 2C, (22−n) "0"s be added at the top of the (n+1) bits to make the number of bits 23, and then the sign bit S be added at the top of the 23 bits to make the number of bits 24.

The integer-value signal sample sequence Y produced by the integer formatting part 12 as described above is, as an integer value, compression-coded in the compressing part 13 by an efficient lossless compression method using correlation of a waveform or the like, and then output as a code sequence Ca. For example, as disclosed in the non-patent literature 1 described above, the lossless compression in the compressing part 13 may be achieved by determining the difference between the value of each sample and a predicted value (integer value), transforming the bit arrangement of a sequence of such differences as described in the part "BACKGROUND ART", and then performing the entropy coding on the resulting sequence, that is, the coordinate bit sequence. That is, the integer-value signal sample sequence Y approximates to the original analog signal waveform from which the input signal sample sequence X from the signal source 11 has been derived. Therefore, the input signal sample sequence X can be efficiently losslessly compression-coded by eliminating, by prediction or transformation, the redundancy due to the correlation among the signal samples.

The difference producing part 14 produces a difference signal (error) Z, which indicates the difference between the integer-value signal sample Y and the corresponding input signal sample X in the floating-point format from the signal source 11. In this example, the floating-point formatting part 15 converts the integer-value signal sample Y again into a signal sample Y' in the floating-point format, and the subtraction part 16 subtracts the resulting signal sample Y' in the floating-point format from the original input signal sample X in the floating-point format, thereby producing the difference digital signal Z in the floating-point format.

In the case where the digital signal sample in the integer format is composed of 24 bits, the floating-point formatting part 15 can convert the digital signal into an input signal in the 32-bit floating-point format without any ambiguity or exception. As described above, the exponent E of the original signal sample sequence X in the floating-point format is likely to be equal to or less than 149, and in such a case, a difference signal sample Z indicating the difference between a sample in the signal sample sequence Y' and a sample in the original input signal sample sequence X in the floating-point format equals to the value of the fractional part of the sample in the original input signal sample sequence X.

The above description concerning the difference producing part 14 is intended only to help understanding of the present invention, and actually, there is no need of converting the integer-value signal sample sequence Y into the floating-point format. The input sample sequence X and the number of digits n of the integer part of the mantissa thereof are input to the difference producing part 14, and if no exception signal y is provided, the sign S, the exponent E and the (23−n) least significant bits of the mantissa M of each sample in the input sample sequence X in the floating-point format are used as the sign S, the exponent E and the (23−n) least significant bits of the mantissa of each difference signal sample Z, respectively, and the remaining most significant n bits of the mantissa are all set at "0". The number of digits, n (n=E−E$_0$), of the integer part of the mantissa equals to the number of digits following the most significant "1" of the corresponding sample in the integer-value signal sample sequence Y. Since the bit length of the integer-value signal sample is fixed, the number of digits of the integer part of the mantissa is also determined when the number of digits preceding the most significant "1" is determined. That is, if the position of the most significant "1" in an integer-value signal sample is found, the number of digits of the integer part of the mantissa of the corresponding floating-point signal sample can also be found. If an exception signal y is provided, the sign of the difference signal sample Z is constituted by the sign S of the input sample, the exponent of the difference signal sample Z is set at E−150, and the mantissa of the difference signal sample Z is constituted by the difference between the mantissa of the input sample sequence X and the signal sample sequence Y'.

The compressing part 17 performs a lossless compression coding on the difference signal Z for each sample combination of an integer-value signal sample sequence Y and an input sample sequence X in the floating-point format, that is, the difference signal Z in the floating-point format from the difference producing part 14 and outputs a code sequence Cb. For example, the compressing part 17 performs the lossless compression coding only on the digit(s) in the difference signal Z in the floating-point format that can assume a value other than "0" for each sample, using the number of digits n of the integer part of the mantissa that is output from the integer formatting part 12. Each sample in the input sample sequence X in the floating-point format is expressed as follows:

$$X = 1.M \times 2^n = X_W.X_F$$

Provided that $X_W = 1M_1$ ($M_1$ with "1" added at the top thereof) indicates the integer part in the binary notation, and $X_F = M_F$ indicates the fractional part, the bits corresponding to the integer part $M_1$ in the mantissa M and the bits corresponding to the fractional part (decimal value) $M_F$ are related to each other as shown in FIG. 4. In this drawing, the mantissa M is shown as a 24-bit value including the one bit at the top of the M in the expression (1), and the position of a decimal point $P_D$ in the sign and magnitude binary notation is shown for convenience.

When the absolute value $X_W$ of the integer part is 0, the expression (1) can be classified into two cases: a case of $E - E_0 = -127$; and a case of $-126 \leq E - E_0 \leq -1$. The former case is a special case of E=0, in which all the 23 bits "$x_{23} \ldots x_1$" of the mantissa M constitute the fractional part $M_F$, and the 23 bits of the mantissa of the sample in the input signal sample sequence X are all "0" by definition. In the case of $-126 \leq E - E_0 \leq -1$, the mantissa constitutes the fractional part, but not all the bits thereof are "0". In any case, in the case where $E - E_0$ assumes a negative value, all the bits of the sample in the integer-value signal sample sequence Y are "0", and the difference signal Z is the same as the sample in the input sample sequence X, so that all the 32 bits of the sample in the signal sample sequence X in the floating-point format are to be coded.

When the absolute value $X_W$ of the integer value is 1, the bit "1" at the position one bit higher than the 23rd bit of the mantissa M (referred to as a 24th bit, hereinafter) represents the integer value $X_W$, and the 23 bits "$x_{23} \ldots x_1$" of the mantissa M represent the fractional part $M_F$.

When the absolute value $X_W$ of the integer value is 2 to 3, the two bits "$1x_{23}$" composed of the 24th bit "1" and the 23rd bit $x_{23}$ represent the integer value $X_W$, in which the bit $x_{23}$ represents the integer part $M_1$ in the mantissa M, and the remaining 22 bits "$x_{22} \ldots x_1$" represent the fractional part $M_F$.

When the absolute value $X_W$ is 4 to 7, the three bits "$1x_{23}x_{22}$" composed of the 24th bit "1", the 23rd bit $x_{23}$ and the 22nd bit $x_{22}$ represent the integer value $X_W$, in which the bits "$x_{23}x_{22}$" represent the integer part $M_1$ in the mantissa M, and the remaining 21 bits "$x_{21} \ldots x_1$" represent the fractional part $M_F$.

When the absolute value $X_W$ is $2^{k-1}$ to $2^k 1$, the k bits composed of the 24th bit "1" and the bits "$x_{23} \ldots x_{23-(k-2)}$" represent the integer value $X_W$, in which the bits "$x_{23} x_{22} \ldots x_{23-(k-2)}$" represent the integer part $M_1$ in the mantissa M, and the remaining (23-k) bits "$x_{23-(k-1)} \ldots x_1$" represent the fractional part $M_F$.

Since the difference signal Z is produced by subtracting the sample sequence Y' in the 32-bit floating-point format converted from the integer-value signal sample sequence Y from the input sample sequence X in the 32-bit floating-point format, the difference signal Z is as shown in FIG. 5. In the case where the absolute value $X_W$ is 0, which corresponds to the above-described case where $E-E_0$ assumes a negative value, the sign S, the exponent E and the mantissa M of the difference signal Z are all the same as those of the input sample X.

In the case where the absolute value $X_W$ of the integer value is 1, the sign S and the exponent E of the sample in the sample sequence Y' are the same as those of the corresponding sample in the sample sequence X, and the mantissa M of the sample is 0. In this case, subtraction of exponents is also performed. Thus, the sign S and the exponent E of the difference signal Z are always the same as those of the corresponding sample in the sample sequence X, that is, 0 and 0, respectively, and the mantissa M of the difference signal Z is the same as the mantissa M of the sample in the sample sequence X.

In the case where the integer value $X_W$ is 2 to 3, the sign S and the exponent E of the sample Y' are the same as those of the sample X, and as for the mantissa M of the sample Y', the 23rd bit $x_{23}$ thereof is the same as that of the mantissa M of the sample X, and the bits constituting the fractional part "$x_{22} \ldots x_1$" thereof are all "0". Therefore, the sign S and the exponent E of the difference signal are always 0, the most significant bit (the 23rd bit) in the mantissa M is always 0, and the remaining bits constituting the fractional part "$x_{22} \ldots x_1$" are the same as the respective corresponding bits of the sample X and vary depending on the sample X.

Similarly, in the case where the integer value $X_W$ of the sample X is $2^{k-1}$ to $2^k-1$, the sign S and the exponent E of the difference signal Z are always 0, and as for the mantissa M thereof, the most significant (k-1) bits "$x_{23} \ldots x_{23-(k-2)}$" corresponding to the integer part of the mantissa M of the sample X are always 0, and the remaining 23-(k-1) bits "$x_{23-(k-1)} \ldots x_1$" are the same as the respective corresponding bits of the mantissa M of the sample X and vary depending on the sample X. In this way, the number of digits h (h=23-n) of the difference signal Z that can be non-zero is determined depending on the range of the integer value of the signal sample sequence Y in the integer format, that is, the number of digits, n+1, of the integer value.

Because of such a relationship, the compressing part 17 performs a lossless compression coding only on the least significant h (h=23-n) bits that can be non-zero in the difference signal Z in the floating-point format, using the number of digits n of the integer part of the mantissa input from the integer formatting part 12. That is, if the number of digits n of the integer part of the mantissa is 0, all the bits of the exponent E and the mantissa M are losslessly compression-coded, and if the number of digits n is not 0 (n≠0), only the least significant h (h=23-n) bits of the mantissa M are losslessly compression-coded. From the above description, it will be understood that the difference signal Z can be produced by inputting the input signal sample X and the number of digits n of the integer part of the mantissa to the difference producing part 14.

Figure 6:
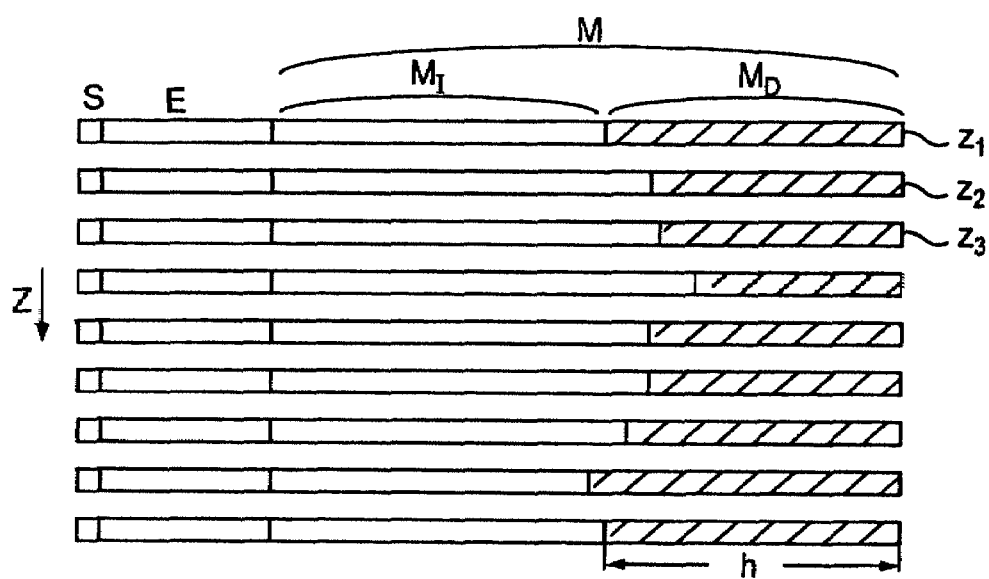
FIG. 6 is a diagram showing portions to be compression-coded of a sequence of digital difference signals.

As described above, when the value of $E-E_0$ in the expression (1) of the sample in the input signal sample sequence X is from -127 to 0, the difference signal Z is the same as the input signal sample X. Therefore, the compressing part 17 codes the 32 bits of the input signal sample X as the difference signal Z. When the value of $E-E_0$ is 1 to 22, in the case where the difference signal sample sequence Z ($=z_1, z_2, z_3, \ldots$) is as shown in FIG. 6, for example, only the part $M_D$ constituted by the bits that can be non-zero is coded, except the case where n≠0. The coding of the bits that can be non-zero can be achieved by entropy coding, such as Huffman coding, of h bits that can be non-zero, or by universal coding of the whole of the bits. That is, only the part shaded in FIG. 6 can be appropriately grouped into samples or frames and simply losslessly compression-coded, such as entropy-coded, on a sample basis or on a frame basis. Since the number of digits (number of bits) h of the part $M_D$ of each sample that contains bits capable of assuming non-zero is determined as h=(23-n), even if all the parts $M_D$ in each frame are coded as a series of bit sequences, the series of bit sequences decoded on the decoder side can be separated again based on the number of bits h capable of assuming non-zero in each sample.

The sign S is contained in the code Ca as a result of coding of the signal sample sequence Y in the integer format, and therefore, there is no need of coding and transmitting the sign S when coding the difference signal Z. In addition, since the n ($=E-E_0$) can be determined from the number of bits n following the most significant "1" except the sign bit of each sample in the integer-value signal sample sequence Y on the receiver side, there is no need of transmitting the number of bits n.

The difference signal Z sometimes has a large number of digits following the decimal point, and in such a case, the coding efficiency can be reduced. Thus, in the embodiment shown in FIG. 1, the quantity of information of the code sequence resulting from coding of the bits capable of assuming non-zero in the difference signal Z is compared with the quantity of information of the bits capable of assuming non-zero that are not coded, and if the latter quantity of information is smaller, the bits capable of assuming non-zero may output as a code sequence Cb without being coded. Alternatively, the quantity of information of the difference signal sample Z is compared between the case where all the bits thereof are coded and the case where no coding is performed, and the difference signal Z of smaller quantity of information may be selected.

As described above, in the exceptional case where the mantissa E of the signal sample sequence X in the floating-point format holds E≧150, the integer formatting part 12 provides an exception signal y, which indicates that the exponent E is fixed to 150, to the difference producing part 14, and the difference producing part 14 produces a difference signal Z in the floating-point format whose exponent is constituted by the difference (E−150) between the fixed exponent value 150 and the exponent E of the sample in the signal sample sequence X and whose mantissa is constituted by the difference in mantissa M. The compressing part 17 losslessly compression-codes the difference signal Z and outputs the resulting code sequence Cb.

As shown in FIG. 1, in the single-signal coding part 120, the input signal sample sequence X in the floating-point format is directly losslessly compression-coded in a compressing part 121, and output therefrom as a code sequence Cc. The lossless compression coding can be achieved by 8-bit universal coding, for example. The auxiliary coding part 103 in the analyzing and selecting part 100 codes auxiliary information as to which of the dual-signal coding part 110 and the single-signal coding part 120 has been selected and outputs the information as an auxiliary code Cd. The code sequences Ca and Cb and the auxiliary code Cd, or the code sequence Cc and the auxiliary code Cd, are output from the output part 104 to be transmitted or recorded in a recording medium.

Figure 7:
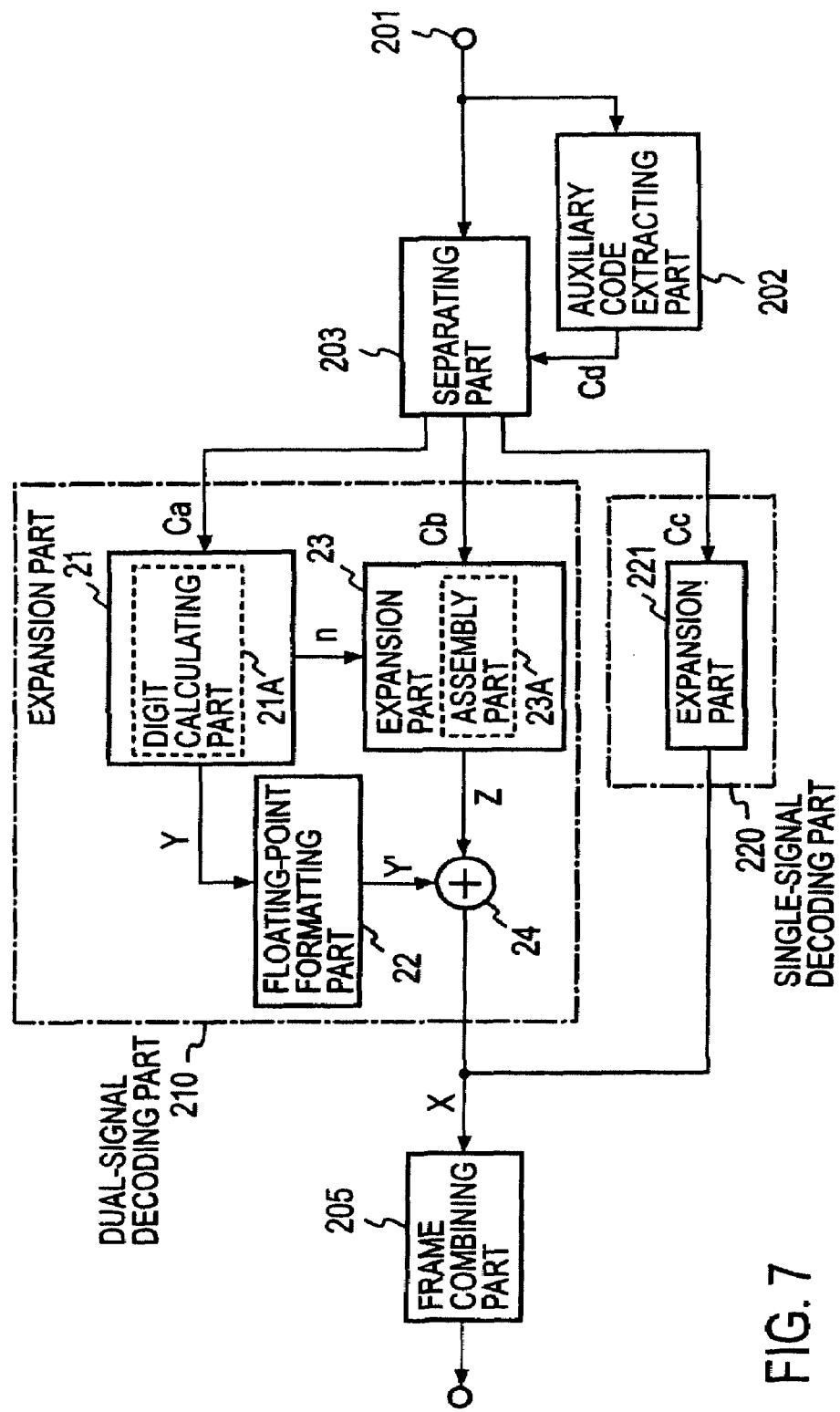
FIG. 7 is a functional diagram of a decoder according to the first embodiment of the present invention.

FIG. 7 shows an embodiment of a decoder according to the present invention, which is associated with the coder shown in FIG. 1.

Code sequences are input at an input terminal 201, and an auxiliary code extracting part 202 extracts the auxiliary code Cd from each frame of code sequences. A separating part 203 is controlled based on the auxiliary code Cd. If the auxiliary code Cd indicates the dual-signal coding, the separating part 203 separates the code sequences Ca and Cb received via the input terminal 201 and passes the code sequences to a dual-signal decoding part 210, or if the auxiliary code Cd indicates the single-signal coding, the separating part 203 separates the code sequence Cc from the code sequence received via the input terminal and passes the code sequence Cc to a single-signal decoding part 220.

The input code sequence Ca input to the dual-signal decoding part 210 is losslessly expansion-decoded in an expansion part 21. This lossless expansion decoding corresponds to the lossless compression coding performed in the compressing part 13 shown in FIG. 1 and is to perform an inverse processing of the lossless compression coding. Therefore, this lossless expansion decoding produces a digital signal sample sequence Y in the 24-bit integer format. In addition, a number-of-digits outputting part 21A in the expansion part 21 determines the number of digits n following the most significant "1" in each expansion-decoded sample as the number of digits of the integer part of the mantissa of the corresponding digital signal in the floating-point format and outputs the number of digits n. The number of digits n is input to an expansion part 23.

The expansion part 23 losslessly expansion decodes the input code sequence Cb. This lossless expansion decoding corresponds to the lossless compression coding performed in the compressing part 17 shown in FIG. 1. Therefore, in the expansion part 23, an assembly part 23A assembles a sequence of expansion-decoded bits into a difference (error) digital signal in the 32-bit floating-point format for each sample based on the number of digits n, and outputs the resulting digital signal as the difference signal Z.

Based on the number of digits n for the first sample in the frame provided from the expansion part 21, if the number of bits n for the first sample does not hold n=0, the assembly part 23A extracts the least significant h (h=23−n) bits from the 23-bit mantissa M of the bit sequence expansion-decoded by the expansion part 23 and assembles the extracted h bits into a difference signal $z_1$, in the 32-bit floating-point format, which is constituted by the shaded part of the first sample $z_1$ shown in FIG. 6. 1 bit of sign S and 8 bits of exponent E are all set at 0, and all the bits constituting the part $M_1$ of the mantissa M corresponding to the integer part shown in FIG. 6 are set at 0. For the next sample, based on the number of digits n (n≠0), h (h=23−n) bits are extracted from the expansion-decoded bit sequence to form a difference signal Z in the 32-bit floating-point format. Similarly, sample sequences $z_2$, $z_3$, . . . shown in FIG. 6 are successively assembled and output. If it holds n=0, 8 bits of exponent E and 23 bits of mantissa M are extracted from the expansion-decoded bit sequence and assembled into a digital signal in the floating-point format. The sign bit S of the decoded difference signal Z is always 0, the bits of the exponent E thereof are always 0 except the case where n=0, the least significant h (h=23−n) bits of the mantissa M thereof can be non-zero, and the remaining bits of the mantissa M thereof are always 0. Thus, in a strict sense, the difference signal is not in the floating-point notation. However, in this specification, the difference signal is referred to as a difference signal in the floating-point format.

The signal sample sequence Y in the 24-bit integer format from the expansion part 21 is converted into a signal sample sequence Y' in the 32-bit floating-point format by the floating-point formatting part 22. A combining part 24 combines the samples in the signal sample sequence Y' with the respective difference signals Z in the floating-point format from the expansion part 23 to reproduce the signal sample sequence X in the floating-point format. The sign of each sample in the reproduced signal sample sequence X is the same as that of the corresponding sample in the signal sample sequence Y', that is, the same as the sign of the corresponding sample in the decoded signal sample sequence Y in the integer format. Except for the case where n=0, the exponent E of each sample in the sample sequence X is the same as that of the corresponding sample in the signal sample sequence Y', the most significant n (n=23−h) bits of the mantissa M of each sample in the sample sequence X are the same as the most significant n bits of the mantissa M of the corresponding sample in the signal sample sequence Y', and the remaining, least significant h (h=23−n) bits of each sample in the sample sequence X are the same as the least significant h bits of the difference signal Z.

The code sequence Cc input to the single-signal decoding part 220 is directly decoded into the original signal sample sequence X in the floating-point format through a lossless expansion-decoding process corresponding to the compression process performed in the compressing part 121 shown in FIG. 1.

The signal sample sequences X in the floating-point format decoded by the dual-signal decoding part 210 and the single-signal decoding part 220 are sequentially combined into a signal sample sequence in the floating-point format by a frame combining part 205.

Modified Embodiment

Figure 8:
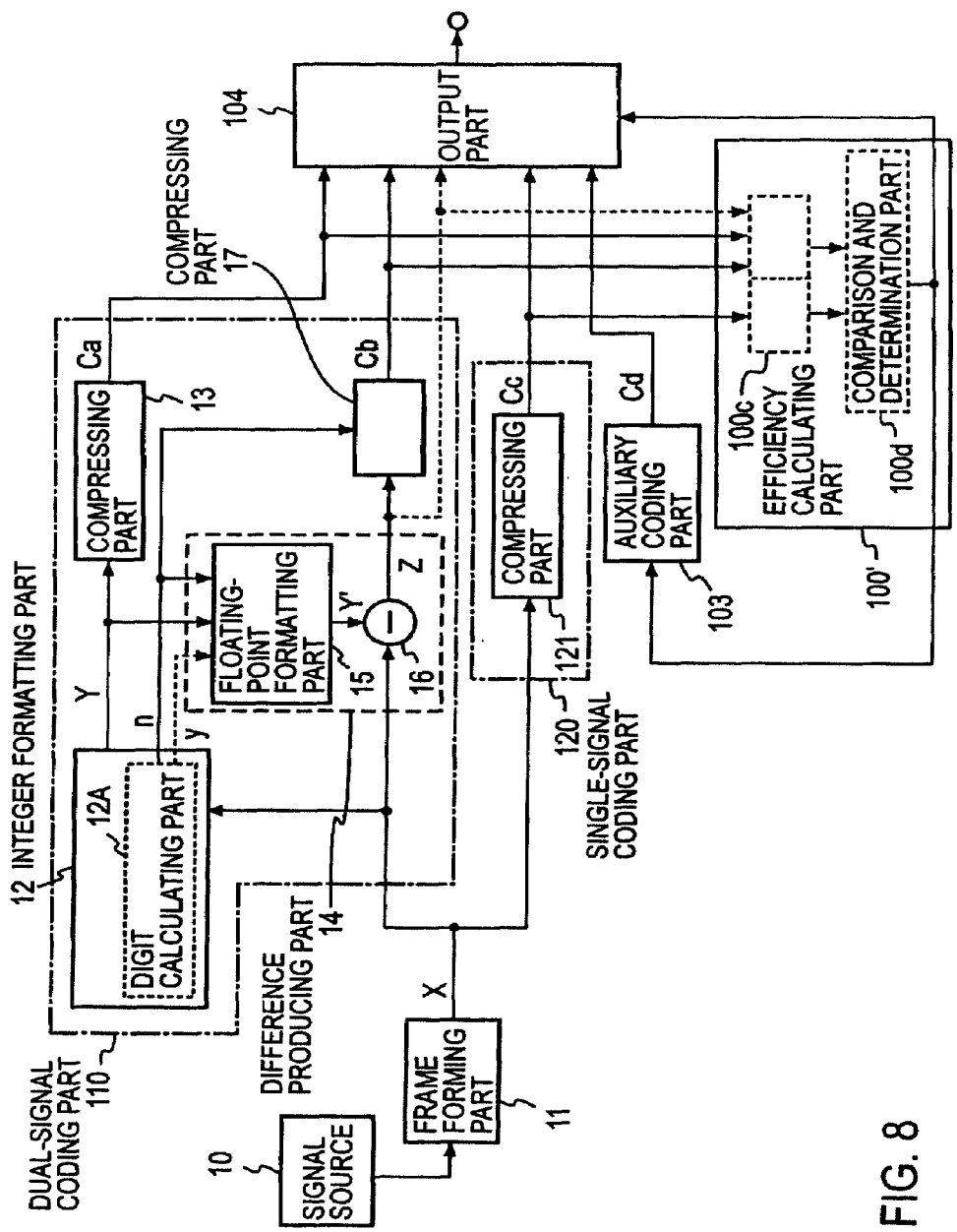
FIG. 8 shows a modified embodiment of the coder shown in FIG. 1.

FIG. 8 shows a modified embodiment of the coder shown in FIG. 1. The coder does not use the analyzing and selecting part 100 shown in FIG. 1. In this case, both the dual-signal coding part 110 and the single-signal coding part 120 code the input signal sample sequence X and input the code sequences Ca and Cb and the code sequence Cc, respectively, to an analyzing and selecting part 100', in which the compression efficiency for each frame is calculated by an efficiency calculating part 100c. For example, the total code length for the relevant frame is calculated for each of the set of code sequences Ca and Cb and the code sequence Cc, and a comparison and determination part 100*d* compares the total code lengths with each other, and determines the code sequence(s) of the shorter total code length as the code sequence(s) compressed with higher efficiency. The determination result is passed to the auxiliary coding part 103, and the auxiliary coding part produces a code Cd. In addition, the output part is controlled based on the comparison result and selectively outputs a code set (Ca, Cb, Cd) or a code set (Cc, Cd). The remaining configuration is the same as that shown in FIG. 1, so that further description thereof will be omitted. As shown by a broken line in the drawing, the difference signal Z may be optionally output as it is, and one of the code sets (Ca, Cb, Cd), (Ca, Z, Cd) and (Cc, Cd), the compression efficiency of which is the highest, may be output. As a decoder suitable for shown in FIG. 8, the decoder shown in FIG. 7 may be used as it is.

In the coder shown in FIG. 1, if the compressing part 17 directly losslessly compression-codes the difference signal Z in the floating-point format, the expansion part 23 in the decoder shown in FIG. 7 does not use the number of digits n and directly decodes the difference signal Z in the floating-point format. In the case of performing such direct lossless compression coding and decoding, the integer formatting part 12 may perform integer-formatting by not only truncation but also rounding and round-up.

Modified Embodiment

There are sometimes cases where an original 24-bit or 16-bit integer-value PCM signal is converted into a floating-point number for the purpose of convenience to form a sequence to be coded instead of using an ordinary floating-point number signal to produce a sequence to be coded. In the case of such a special floating-point sequence, the bits that can be non-zero described above with reference to the first embodiment disappear. Thus, the sign S, the exponent E and the mantissa M of the difference (error) signal Z in the floating-point format from the difference producing part 14 are all zero, and there is no need of transmitting the difference signal Z. In this case, for example, two bits are used as auxiliary information, and only needed is to inform the decoder that, if the two bits are "00", it means that the original digital signal is a 16-bit integer-value signal sample, if the two bits are "01", it means that the original digital signal is a 24-bit integer-value signal sample, and if the two bits are "10", it means that the original digital signal is a signal sample other than those described above. To this end, the 2-bit auxiliary information is added at the top of the code sequence Ca output from the compressing part 17. Efficient compression can be achieved if only the 2-bit auxiliary code is output as the code sequence Cb in the former two cases, or the auxiliary code is output together with the code sequence Cb in the latter case.

Second Embodiment

According to a second embodiment of the present invention, a signal sample sequence X in the floating-point format is always converted into a signal sample sequence Y in the integer format. However, the difference signal Z in the floating-point format is coded by one of two lossless compression coding processes which is expected to provide a higher compression efficiency. Specifically, one is a process of losslessly coding only the bits capable of assuming non-zero in the difference signal in the floating-point format according to the number of digits of each sample in the signal sample sequence Y in the integer format as described with reference to the first embodiment. The other is a process of directly losslessly compression-coding the difference signal in the floating-point format.

Figure 9:
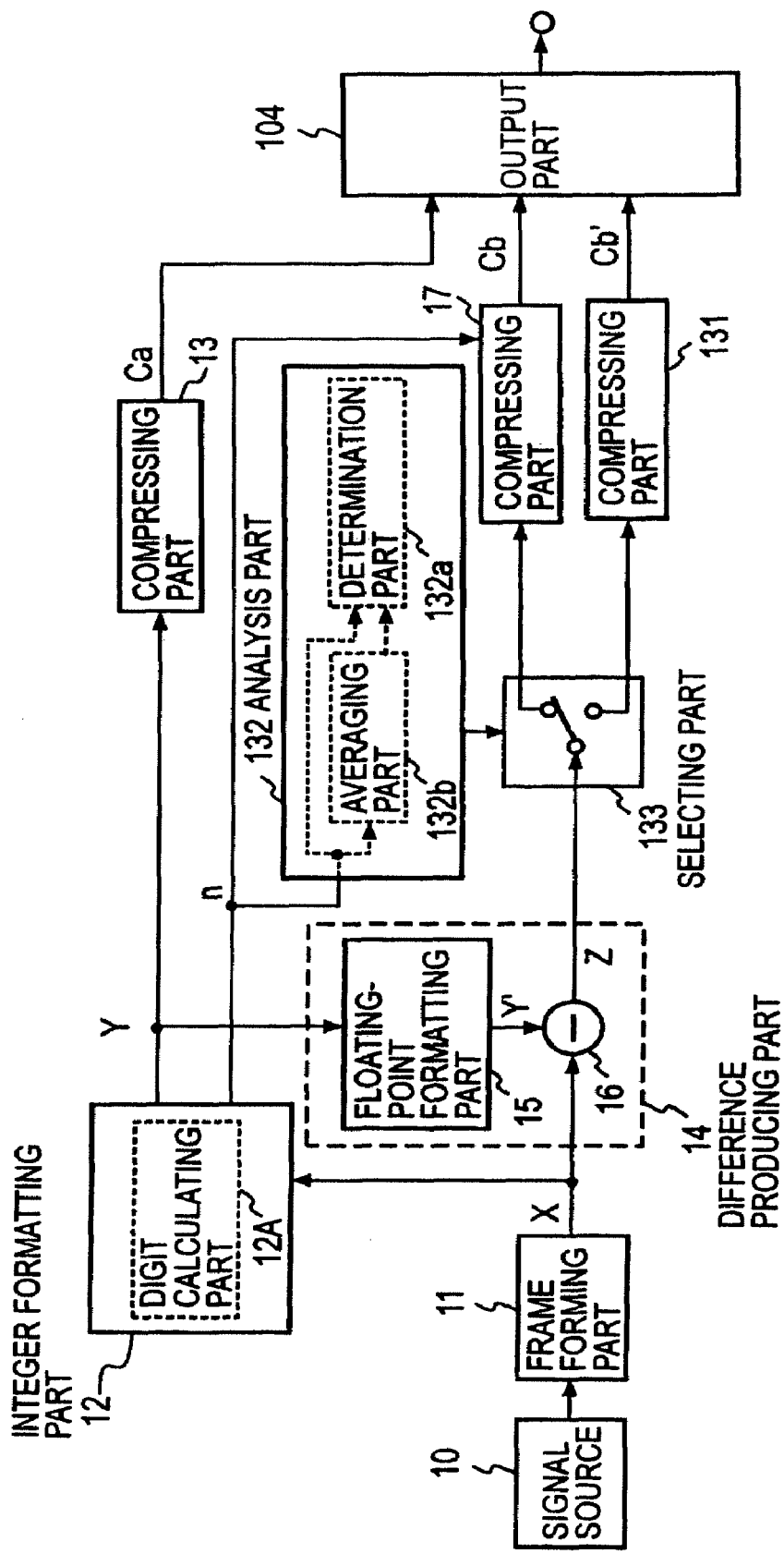
FIG. 9 is a functional diagram of a coder according to a second embodiment of the present invention.

FIG. 9 shows a functional configuration of a coder according to the second embodiment. In the drawing, the parts corresponding to those shown in FIG. 1 are denoted by the same reference numerals as those in FIG. 1, and redundancy of the descriptions thereof will be avoided (the same applies to the other embodiments). In the second embodiment, in order to code the difference signal Z, there are provided a compressing part 17 that uses the number of digits n following the most significant "1" in the integer-value sample and a compressing part 131 that directly losslessly compression-codes the difference signal Z in the floating-point format. The number of digits n of the integer part of the mantissa M (the number of digits following the most significant "1" in the integer-value sample) is input to an analysis part 132 from an integer formatting part 12. A determination part 132*a* compares the number of digits n with a reference value, and a selecting part 133 is controlled based on the comparison result. The most significant n bits of the mantissa M of the difference signal Z are "0", and as the number of digits n increases, the compression efficiency of the compressing part 17 increases. Thus, if the number of digits n is equal to or greater than the reference value, the difference signal Z is supplied to the compressing part 17, or if the number of digits n is smaller than the reference value, the difference signal Z is supplied to the compressing part 131. Then, a code sequence Cb corresponding to the difference signal Z losslessly compression-coded by the compression part 17 or 131 is to be input to an output part 104.

If the number of digits n is large, that is, if the amplitude is large, the number of bits h (=23−n) capable of assuming non-zero in each difference signal sample Z is small as described above with reference to FIG. 5, and thus, the difference signal Z can be compressed efficiently. On the other hand, if the number of digits n is small, that is, if the amplitude is small, the number of bits h capable of assuming non-zero in the difference signal Z is large, and thus, it is more advantageous to use the compressing part 131 that losslessly compression-codes the difference signal Z in the floating-point format by the typical 8-bit universal coding, for example. For example, one bit of "0" is added at the top (or the bottom) of the 23-bit mantissa of each difference signal sample to form a a 24-bit bit sequence, the bit sequence is divided into 3 symbols (i.e., coding units) each containing 8 bits, and each of the 8-bit symbols is compression-coded. Alternatively, only the bits capable of assuming non-zero in the mantissa of each difference signal sample may be separated on an 8-bit basis. If the number of the bits is not divisible by 8, a required number of bits of "0" are added to the bit sequence, the resulting bit sequence is divided into 8-bit symbols, and each of the symbols is compression-coded. For example, if the number of bits capable of assuming non-zero in the mantissa of a sample is 11, five bits of "0" are added to the bit sequence, and the resulting bit sequence is divided into two 8-bit symbols.

For example, the reference value used in the determination part 132*a* is 10, if the amplitude length of the digital signal sample sequence Y in the integer format is 16 bits. As with the predetermined value used in the determination part 101*b* in the first embodiment, the reference value is determined based on various conditions so that high compression efficiency is achieved.

Selection between the compressing parts 17 and 131 may be performed for each sample. Alternatively, the selection may be performed for each frame in such a manner that an averaging part 132b in the analysis part 132 calculates the average number of digits n following the most significant "1" for the integer-format signal samples in each frame, and the compressing part 17 is selected if the average is equal to or greater than a reference value, or the compressing part 131 is selected if the average is smaller than the reference value. In the case where selection between the compressing parts 17 and 131 is performed for each sample, for example, the compressing part 17 couples the bits capable of assuming non-zero in each of the selected samples in the input frame, and performs entropy coding of the coupled bits. Since the number of digits n can be determined from the signal sample in the integer format decoded on the decoder side, even when the selection between the compressing parts 17 and 131 is performed based on the number of digits n, there is no need of transmitting an auxiliary code that indicates which of the compressing parts 17 and 131 has been selected.

Figure 10:
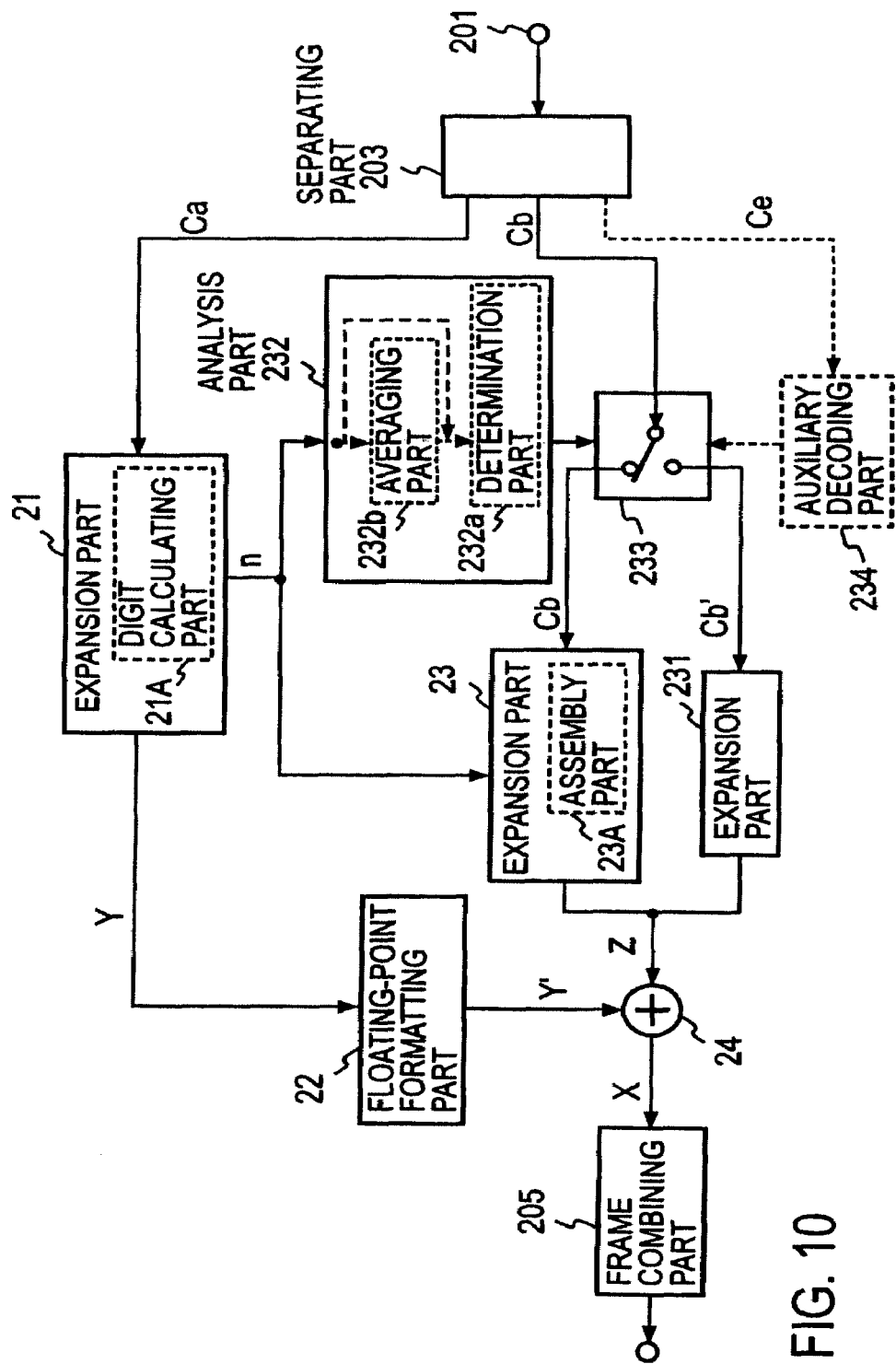
FIG. 10 is a functional diagram of a decoder according to the second embodiment of the present invention.

FIG. 10 shows an embodiment of a decoder associated with the coder shown in FIG. 9, in which the parts corresponding to those of the decoder shown in FIG. 7 are denoted by the same reference numerals as in FIG. 7. A code sequence Ca separated by a separating part 203 is always input to an expansion part 21 and decoded and expanded into a signal sample sequence Y in the integer format. For expanding the code sequence Cb, an expansion part 231 is provided in addition to the expansion part 23.

The number of digits n following the most significant "1" in the digital signal sample in the integer format from the expansion part 21 is input to an analysis part 232. The analysis part 232 is configured the same as the analysis part 132 shown in FIG. 9. A determination part 232a compares the number of digits n with a reference value, and a selecting part 233 is controlled so as to supply the code sequence Cb to the expansion part 23 if the number of digits n is equal to or greater than the reference value, and to supply the code sequence Cb to the expansion part 231 if the number of digits n is smaller than the reference value. As described above with regard to the first embodiment, the expansion part 23 extracts h bits capable of assuming non-zero from the decoded and expanded bit sequence, the number h being determined by the number of digits n, and an assembly part 23a assembles the extracted bits into a difference signal Z in the floating-point format.

The expansion part 231 directly decodes and expands the code sequence Cb into a difference signal Z in the floating-point format through a decoding and expanding process corresponding to the process performed in the compressing part 131 shown in FIG. 9. In the case where the analysis part 132 shown in FIG. 9 uses the average of number of digits n, an averaging part 232b in the analysis part 232 calculates the average of the numbers of digits n, which is compared with a reference value. Based on the comparison result, the selecting part 233 is controlled to supply the code sequence Cb to the expansion part 23 or 231. The expansion part 23 decodes the code sequence Cb into a bit sequence composed of bits capable of assuming non-zero, as in the case described with reference to FIG. 7. From the bit sequence, the mantissa of the difference signal is reproduced using the number of digits n, and then, the difference signal Z in the floating-point is assembled.

As described above, in this embodiment, although the difference signal Z is in the floating-point format, all the bits of the exponent and sign of the difference signal Z in the floating-point format produced by the difference producing part 14 in the coder are "0". Therefore, the exponent and sign are not transmitted to the decoder, and the decoder assembles the mantissa of the difference signal Z from the bits capable of assuming non-zero decoded by the expansion part 23 and then assembles the difference signal Z in the floating-point format by adding the exponent composed of "0" bits and the sign bit "0" to the mantissa.

The expansion part 231 receives the code sequence Cb as a code sequence Cb' and performs a decoding process which is the inverse of the coding performed in the compressing part 131 shown in FIG. 9, thereby directly forming the difference signal Z. An adder 24 sums any of these difference signals Z and the sample Y' in the floating-point format corresponding to the sample Y in the integer format, thereby forming the signal sample X in the floating-point format.

Modified Embodiment

Figure 11:
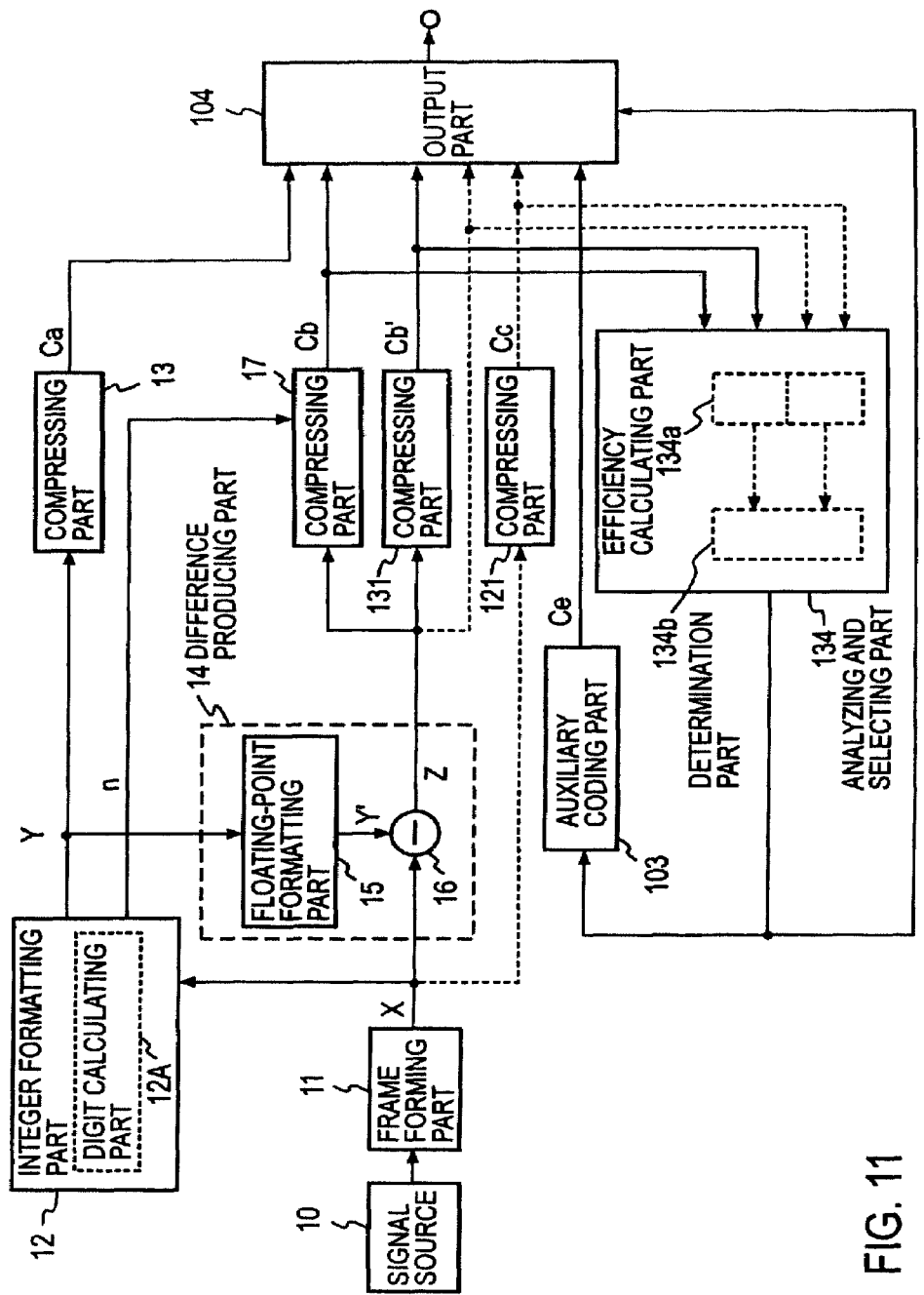
FIG. 11 is a functional diagram of a modification of the coder according to the second embodiment of the present invention.

FIG. 11 shows a modification of the embodiment shown in FIG. 9, in which the parts corresponding to those shown in FIG. 9 are denoted by the same reference numerals as in FIG. 9. In this modified embodiment, instead of using the analysis part 132 and the selecting part 133 shown in FIG. 9, compression coding is performed both in compressing parts 17 and 131, it is determined which of the compressing parts can achieve coding with higher compression efficiency, and the code produced by the compressing part of higher compression efficiency is output. Specifically, the difference signal Z may be losslessly compression-coded by both the compressing parts 17 and 131, the resulting code sequences Cb and Cb' may be input to an analyzing and selecting part 134, an efficiency calculating part 134a and a determination part 134b may determine which of the compressing parts 17 and 131 codes the difference signal Z with higher compression efficiency for the relevant frame, and the code sequence of higher compression efficiency may be output as the code sequence Cb from an output part 104. In this case, an auxiliary code Ce that indicates which of the compressing parts 17 and 131 has produced the code sequence Cb has to be output from an auxiliary coding part 103.

A decoder suitable for the coder shown in FIG. 11 is the decoder shown in FIG. 10 with the analysis part 232 removed and an auxiliary decoding part 234 shown by a broken line provided. The auxiliary decoding part 234 decodes the auxiliary code Ce separated by the separating part 203, and based on the decoding result, the selecting part 233 is controlled to supply the code sequence Cb to the expansion part 23 or 231. The remaining operation is the same as that of the decoder adapted for the coder shown in FIG. 9.

The analyzing and selecting part 134 and the auxiliary coding part 103 shown in FIG. 11 may be added to the coder configured as shown in FIG. 9, so that it is possible to make a selection between the determination based on the number of digits n and the determination based on the compression efficiency, and the auxiliary decoding part 234 may be provided in the decoder shown in FIG. 10 in addition to the analysis part 232, so that any of the determination methods can be used. However, corresponding determination methods have to be used in the coder and the decoder.

Third Embodiment

Figure 12:
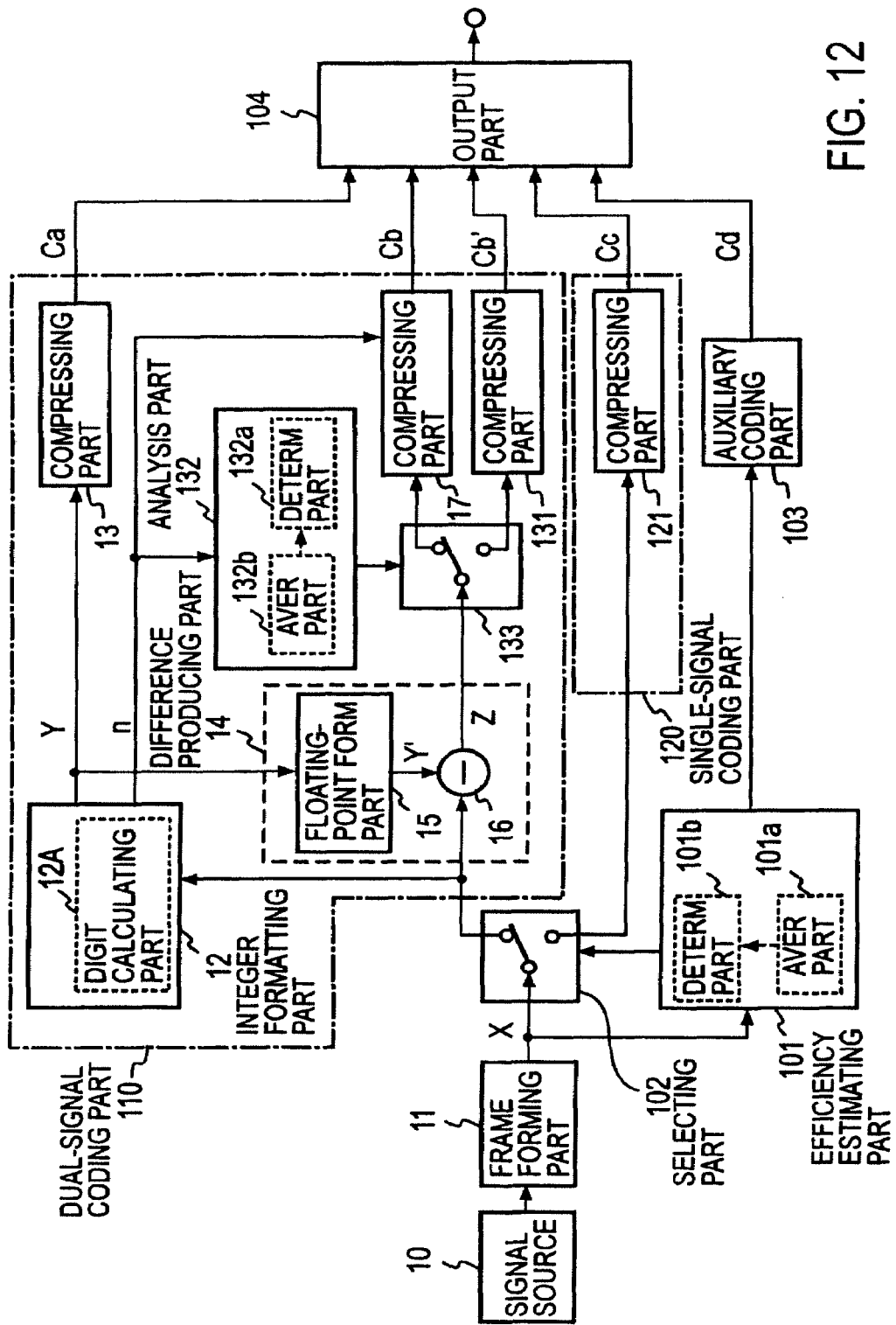
FIG. 12 is a functional diagram of a coder according to a third embodiment of the present invention.

A third embodiment of the present invention is a combination of the first embodiment shown in FIG. 1 and the second embodiment shown in FIG. 9. FIG. 12 shows a functional configuration of a coder according to the third embodiment. In the drawing, the parts corresponding to those shown in FIGS. 1, 8, 9 and 11 are denoted by the same reference numerals as in those drawings, and redundancy of the descriptions thereof will be avoided. According to this embodiment, depending on the combination of selections made by selecting parts 102 and 133, any of code sequence sets (Ca, Cb, Cd), (Ca, Cb', Cd) and (Cc, Cd) is selected and output.

Selection from among such three code sequence sets can be made by additionally providing the compressing part 121 shown in FIG. 8 in the same manner as shown by a broken line in the embodiment shown in FIG. 11, and selecting one of the code sequence sets which is of the highest compression efficiency by an analyzing and selecting part 134.

Figure 13:
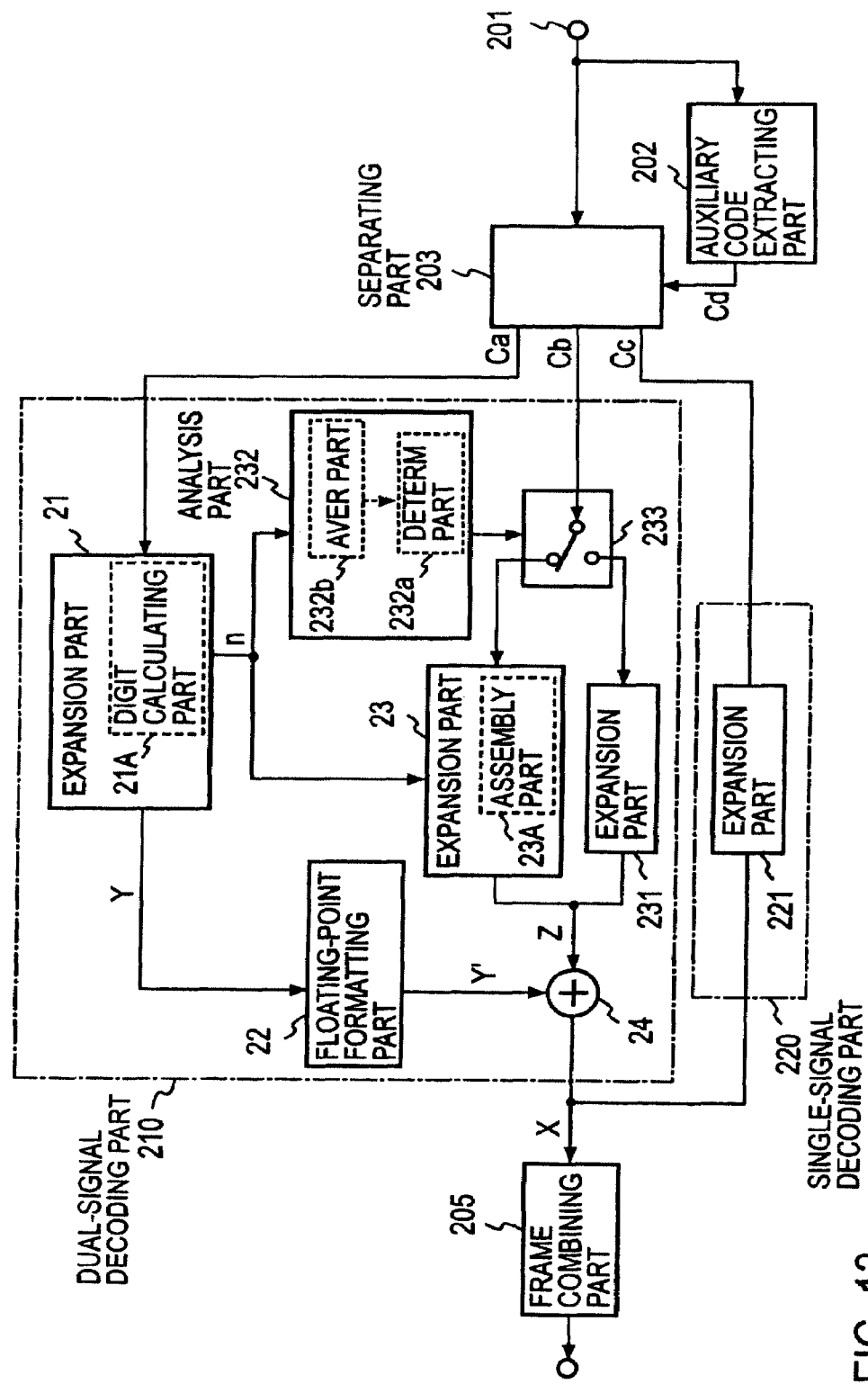
FIG. 13 is a functional diagram of a decoder according to the third embodiment of the present invention.

A decoder according to the third embodiment is shown in FIG. 13. In this drawing, the parts corresponding to those shown in FIGS. 7 and 10 are denoted by the same reference numerals, and redundancy of the description thereof will be omitted.

Fourth Embodiment

According to the first embodiment described above, there is provided a coder that converts the input signal sample X in the floating-point format into the integer format by truncating the fractional part thereof and codes only the bits capable of assuming non-zero in the difference signal Z taking advantage of the fact that all the bits of the integer part in the mantissa of the difference signal Z are "0", thereby improving the compression efficiency. In addition, according to the second embodiment, there is provided a coder that chooses the higher one of the compression efficiency in the case where only the bits capable of assuming non-zero are coded and the compression efficiency in the case where all the bits are coded. According to a fourth embodiment, in addition to truncating the part following the decimal point, a predetermined number of bits of the integer part are also truncated to produce an integer-value signal sample Y. In the example described below, there will be shown a case where, in the conversion into a 16-bit integer value through truncation of bits following the decimal point, 8 bits are further truncated. However, the present invention can be applied to any conversion into an integer value composed of 17 bits to 23 bits.

According to the fourth embodiment, the input signal sample X in the floating-point format can be coded through the same process regardless of whether the original signal from which the input signal sample X has been derived is a floating-point signal, a 24-bit integer-value signal or a 16-bit integer-value signal. However, for convenience of explanation of the principle of operation, a case where the input signal sample X is derived from a floating-point signal, a case where the input signal sample X is derived from a 24-bit integer-value signal containing one sign bit, and a case where the input signal sample X is derived from a 16-bit integer-value signal containing one sign bit will be described in order.

Figure 14A:
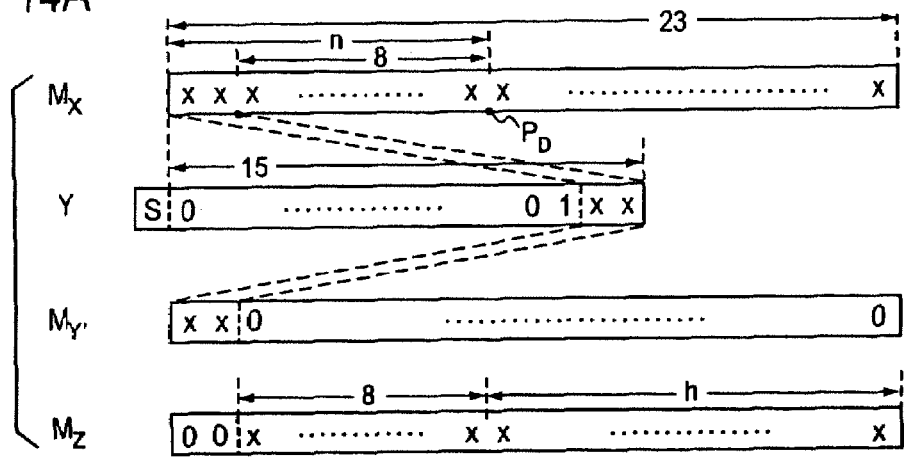
FIG. 14A is a diagram for illustrating a process of converting an input signal X in the floating-point format, which has been derived from a floating-point signal, into a 16-bit integer-value signal.

With reference to FIG. 14A, there will be described conversion of an input signal sample X derived from a floating-point signal into a 16-bit integer value and production of a difference signal Z. In this drawing, a value "x" can be "0" or "1" (that is, a value "x" can be non-zero). "$M_X$" represents 23 bits of the mantissa of the input signal sample X in the floating-point format, and "$P_D$" represents the position of the decimal point that indicates the boundary between the integer part constituted by the most significant n ($n=E-E_0$) bits and the fractional part. By reducing the exponent E of the sample X to E−8, the position of the decimal point $P_D$ of the mantissa $M_X$ is shifted toward the most significant bit position by 8 bits. As a result, in the example shown in FIG. 14A, the most significant 2 (n−8=2) bits "xx" of the mantissa $M_X$ constitute the integer part of the mantissa after shifting. Then, a bit "1" is added at the top of the 2 bits constituting the integer part, and the resulting sequence of bits "1xx" is used as the least significant bits of a 16-bit integer-value signal sample Y.

Each sample in the 16-bit integer-value signal sample Y is shifted toward the most significant bit position by 8 bits, that is, 8 bits of "0" are added at the bottom of the 16-bit integer-value signal sample Y, and then, the resulting signal sample sequence is converted into a signal sample sequence Y' in the floating-point format. Thus, the exponent E of the resulting signal sample sequence Y' in the floating-point format has been added with 8 and equals to the exponent E of the input signal sample sequence X. The mantissa $M_{Y'}$ of the signal sample sequence Y' is formed by setting, as the most significant bits, the bits of the integer part that follow the most significant "1" of the integer-value signal sample sequence Y having been shifted toward the most significant bit position by 8 bits, that is, the 2 bits "xx" in this example, and setting all the following bits at "0". For convenience, FIG. 14A shows a relation between the integer part following the most significant "1" in the sample sequence Y yet to be shifted by 8 bits and the mantissa $M_{Y'}$ of the signal sample sequence Y' in the floating-point format resulting from conversion. The mantissa $M_Z$ of the difference signal Z is the difference between the mantissa $M_X$ and the mantissa $M_{Y'}$. The most significant (n−8) bits of the mantissa $M_Z$ of the difference signal Z, or the most significant 2 bits in this example, are "00", and the following bits (fractional part) equal to the respective corresponding bits of the mantissa $M_X$. That is, all the bits that follow the most significant bits "xx" constituting the integer part of the mantissa $M_Z$ can be non-zero.

As for the difference signal Z, only the least significant 23−(n−8) bits of the mantissa M that can be non-zero have to be coded. The number of the most significant (n−8) bits of the mantissa $M_Z$ that are always set at 0 is the same as the total number of bits following the most significant "1" in the integer-value signal sample sequence Y decoded on the receiving side. As shown in FIG. 15A, the part of the mantissa M constituted by bits that can be non-zero is reduced as the number of bits (n−8) of the integer part increases.

Figure 14B:
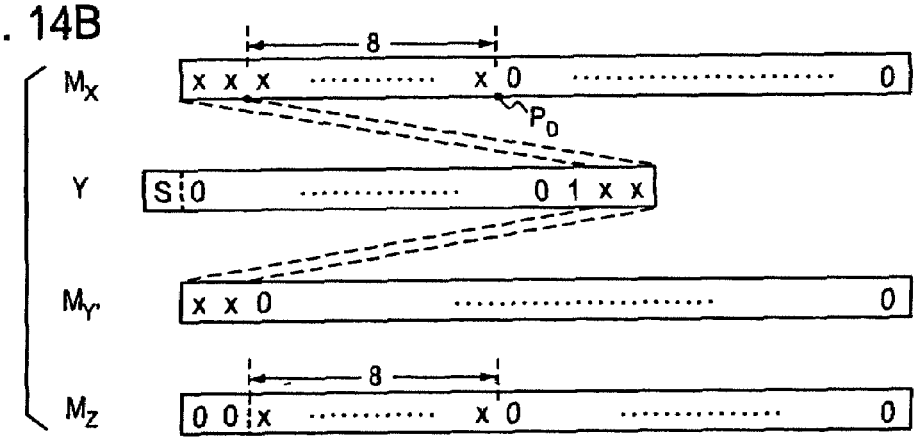
FIG. 14B is a diagram for illustrating a process of converting an input signal X in the floating-point format, which has been derived from a 24-bit integer-value signal, into a 16-bit integer-value signal.

FIG. 14B shows a case where the input signal sample sequence X in the floating-point format is derived from 24-bit integer-value signals. Therefore, the mantissa $M_X$ of the sample sequence X differs from the mantissa $M_X$ shown in FIG. 14A in that all the bits following the decimal point $P_D$ are "0" as shown in FIG. 14B. In FIG. 14B, again, the exponent E of the input signal sample X is reduced to E−8, thereby shifting the position of the decimal point $P_D$ toward the most significant bit position by 8 bits. Then, the resulting 16-bit integer-value signal sample sequence Y is the same as in the case shown in FIG. 14A. Therefore, the mantissa $M_{Y'}$ of the signal sample sequence in the floating-point format converted from the integer-value signal sample sequence Y is also the same as in the case shown in FIG. 14A.

However, the mantissa $M_Z$ of the difference signal is the difference between the mantissas $M_X$ and $M_{Y'}$, and as shown in FIG. 14B, the integer part of the mantissa $M_Z$ of the difference signal Z is "00", the following 8 bits represents a range of bits that can be non-zero, and the bits further following the 8 bits are all "0". The range of bits that can be non-zero is shifted toward the least significant bit position as the number of bits constituting the integer part increases, as shown in FIG. 15B.

Figure 14C:
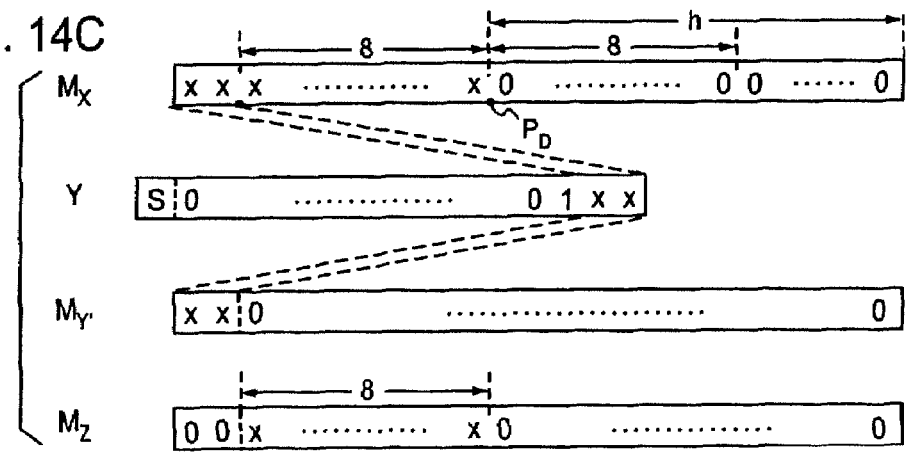
FIG. 14C is a diagram for illustrating a process of converting an input signal X in the floating-point format, which has been derived from a 16-bit integer-value signal, into a 16-bit integer-value signal.

FIG. 14C shows a case where the input signal sample in the floating-point format is derived from a 16-bit integer-value signal sample containing one sign bit. Therefore, in the 23-bit mantissa $M_X$, the 8 bits following the decimal point $P_D$ are all "0", and the bits following the 8 bits are also all "0". While the number of digits h following the decimal point varies with the value of n according to h=23−n, the case shown in FIG. 14C differs from the case shown in FIG. 14B in that the number of digits h does not become smaller than 8.

In FIG. 14C, the exponent E of the input signal sample sequence X is reduced to E−8, thereby shifting the position of the decimal point $P_D$ toward the most significant bit position by 8 bits, and a 16-bit integer-value signal sample sequence Y is produced using the integer part "xx" of the mantissa after shifting in the same manner as shown in FIGS. 14A and 14B. Therefore, the mantissa $M_{Y'}$ of the sample sequence in the floating-point format converted from the sample sequence Y is also the same as in the case shown in FIGS. 14A and 14B. In addition, as in the case shown in FIG. 14B, the most significant (n−8) bits of the integer part of the mantissa $M_Z$ of the difference signal Z are all "0", the following 8 bits represents a range of bits that can be non-zero, and the bits further following the 8 bits are all "0". In this case also, as shown in FIG. 15B, as the number of digits (n−8) of the integer part increases, the number of digits "0" following the 8 bits that can be non-zero decreases, although the number of digits does not become smaller than 8.

As can be apparent from the above description, whether the input signal sample in the floating-point format is derived from a 24-bit integer-value signal, a 16-bit integer-value signal or a floating-point signal, the 16-bit integer-value signal sample Y can be produced through 8-bit truncation by shifting the decimal point toward the most significant bit position by 8 bits by reducing the exponent E of the input signal sample X to E−8, adding "1" at the top of the most significant (n−8) bits constituting the integer part of the mantissa $M_X$, or the bits "xx" in the example shown in the drawings, and adopting the resulting integer value "1xx" as the least significant bits of the 16-bit integer-value signal sample Y. In addition, the mantissa $M_Z$ of the difference signal Z can result from setting the most significant (n−8) bits of the mantissa $M_X$ of the input signal sample X at "0".

The 16-bit integer-value signal sample Y thus obtained can be compression-coded in the same manner as in the embodiment shown in FIG. 1. On the other hand, as for the difference signal Z, the most significant (n−8) bits of the mantissa $M_Z$ that are always "0" are not coded, and the following 8 bits that can be non-zero and the remaining (23−n) bits further following the 8 bits are compression-coded separately.

In the examples described above, the 16-bit integer value is produced by shifting the decimal point in the 23-bit mantissa toward the most significant bit position by 8 bits and truncating the bits following the shifted decimal point. In general, m bits (m: any integer falling within a range $22 \geq m \geq 8$) can be truncated by reducing the exponent E of the input signal sample to E−m and adopting the most significant (n−m) bits of the resulting mantissa $M_X$ as the integer part. In addition, the mantissa of the difference signal Z can be coded efficiently if the most significant (n−m) bits that are always "0" are not coded, and the following m bits that can be non-zero and the remaining (23−n) bits further following the m bits are coded separately.

Figure 16:
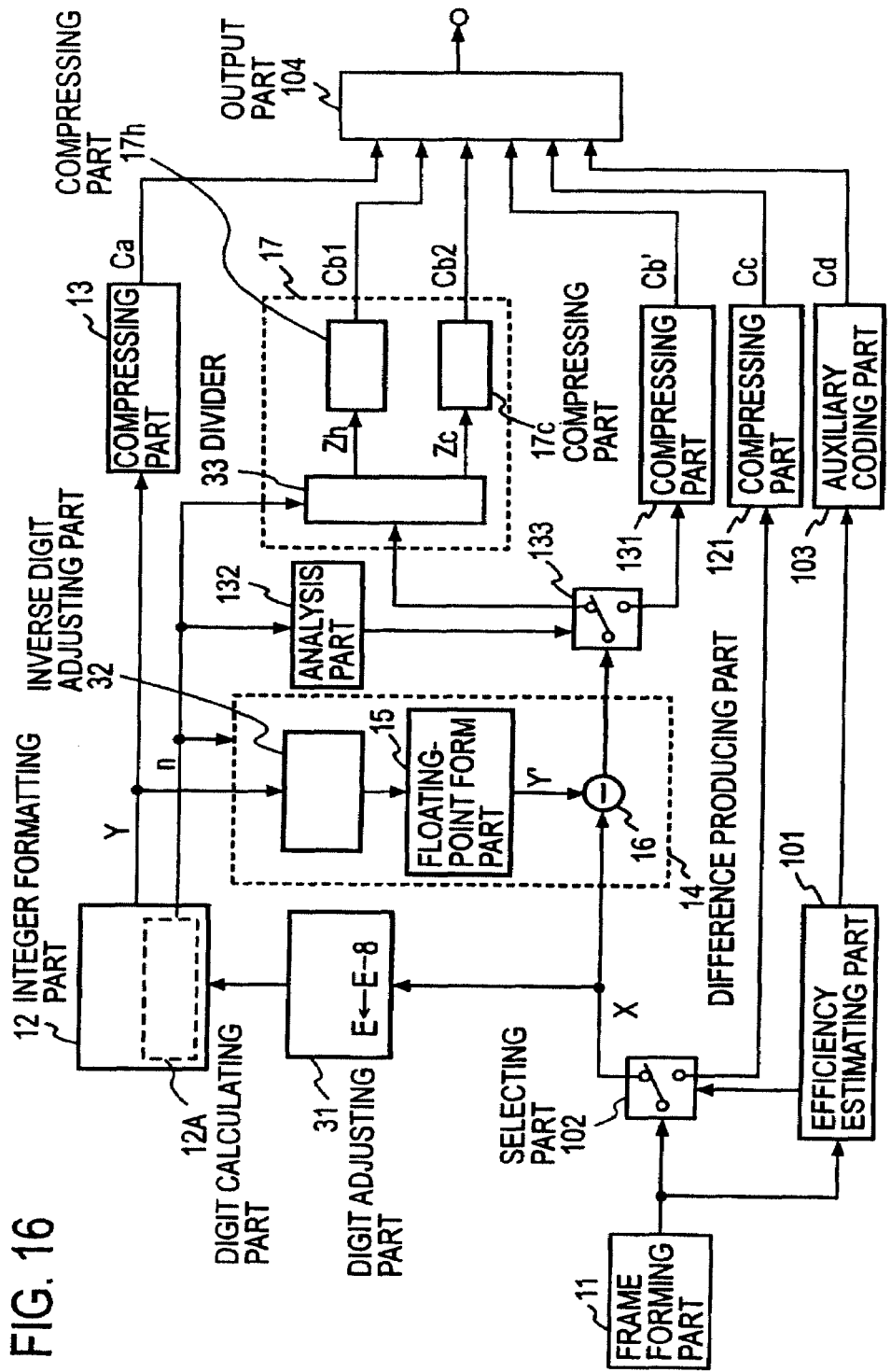
FIG. 16 is a functional diagram of a coder according to a fourth embodiment of the present invention.

FIG. 16 shows a coder, in which the parts corresponding to those shown in FIG. 12 are denoted by the same reference numerals. As described above with reference to FIGS. 14A, 14B and 14C, a digit adjusting part 31 reduces the exponent E of the input signal sample sequence X in the floating-point format, which is received from a selecting part 102, to E−8, thereby shifting the decimal point toward the most significant bit position by 8 bits. An integer formatting part 12 truncates the fractional part following the decimal point having been shifted by 8 bits and adds "1" at the top of the resulting integer part to form a 16-bit (=24−8) signal sample sequence Y in the integer format. A compressing part 13 losslessly compresses the signal sample sequence Y and outputs a code sequence Ca.

An inverse digit adjusting part 32 shifts the signal sample sequence Y in the 16-bit integer format by 8 bits in the direction opposite to the shifting by the digit adjusting part 31, that is, inserts 8 bits of "0" at the bottom of the 16-bit signal sample Y to shift the whole signal sample Y by 8 bits toward the most significant bit position, thereby forming a 24-bit signal sample in the integer format. A floating-point formatting part 15 converts the resulting signal sample in the 24-bit integer format into a signal sample sequence Y' in the floating-point format. A subtraction part 16 determines the difference between the signal sample sequence Y' in the floating-point format and the input signal sample sequence X, thereby producing a difference signal Z in the floating-point format. Actually, such processings by the inverse digit adjusting part 32, the floating point formatting part 15 and the subtraction part 16 are not performed, and a difference producing part 14 can simply use the number of digits n of the integer part of the mantissa received from the integer formatting part 12 to extract the least significant 8+h (h=15−n) bits of the mantissa $M_X$ of each input signal sample X in the case where n≠0, or to extract the exponent E and the mantissa $M_X$ in the case where n=0. As in the case shown in FIG. 12, the difference signal Z is passed to a compressing part 17 or 131 depending on the output of an analyzing part 132.

The compressing part 17 comprises a divider 33 and two compressors 17h and 17c. The difference signal Z is input to the divider 33. The distributor receives also the number of digits n of the integer part of the mantissa of each sample X after shifting from the integer formatting part 12. In the case where n≠0, each difference signal sample Z is divided into a digit subset Zh containing bits capable of assuming non-zero determined by the number of digits n, that is, containing the least significant h bits (h=15−n) and a digit subset Zc containing bits capable of assuming non-zero determined by the conversion of the signal sample sequence Y from the 24-bit integer format into the 16-bit integer format or determined by the number of bits of the signal sample Y in the integer format, that is, containing the (h+1)th to (h+8)th least significant bits. In the case where n=0, each difference signal sample Z is divided into a digit subset Zh composed of 8 bits of the exponent E and the least significant (23−8) bits of the mantissa and a digit subset Zc composed of the most significant 8 bits of the mantissa. The compressors 17h and 17c losslessly compression-code the digit subsets Zh and Zc by entropy coding or the like and output code sequences Cb1 and Cb2, respectively.

Therefore, the compressor 17h primarily receives and losslessly compression-codes the least significant bit(s) of the mantissa M that can be non-zero. If the original digital signal is a 24-bit or 16-bit integer-value signal, the least significant h bits in the digit subset Zh input to the compressor 17h are all "0" except the case where n=0 as shown in FIGS. 14B and 14C, and thus, efficient compression thereof can be achieved.

As shown in FIGS. 14A, 14B and 14C, the compressor 17c losslessly compression-codes the 8 least significant bits that can be non-zero, that is, the (h+1)th to (h+8)th least significant bits, regardless of whether the input signal sample X is derived from a general floating-point signal, a 24-bit integer-value signal or a 16-bit integer-value signal. This enables improvement of the total compression efficiency, compared with the case where all the bits that can be non-zero in the difference signal Z are collectively compression-coded by the compressing part 17 shown in FIG. 1. As can be seen from FIG. 16, the use of the compressors 17c and 17h can be applied not only to the coder according to the embodiment shown in FIG. 12 but also to the coder according to each of the embodiments shown in FIG. 1, 8, 9 and 11.

Figure 17:
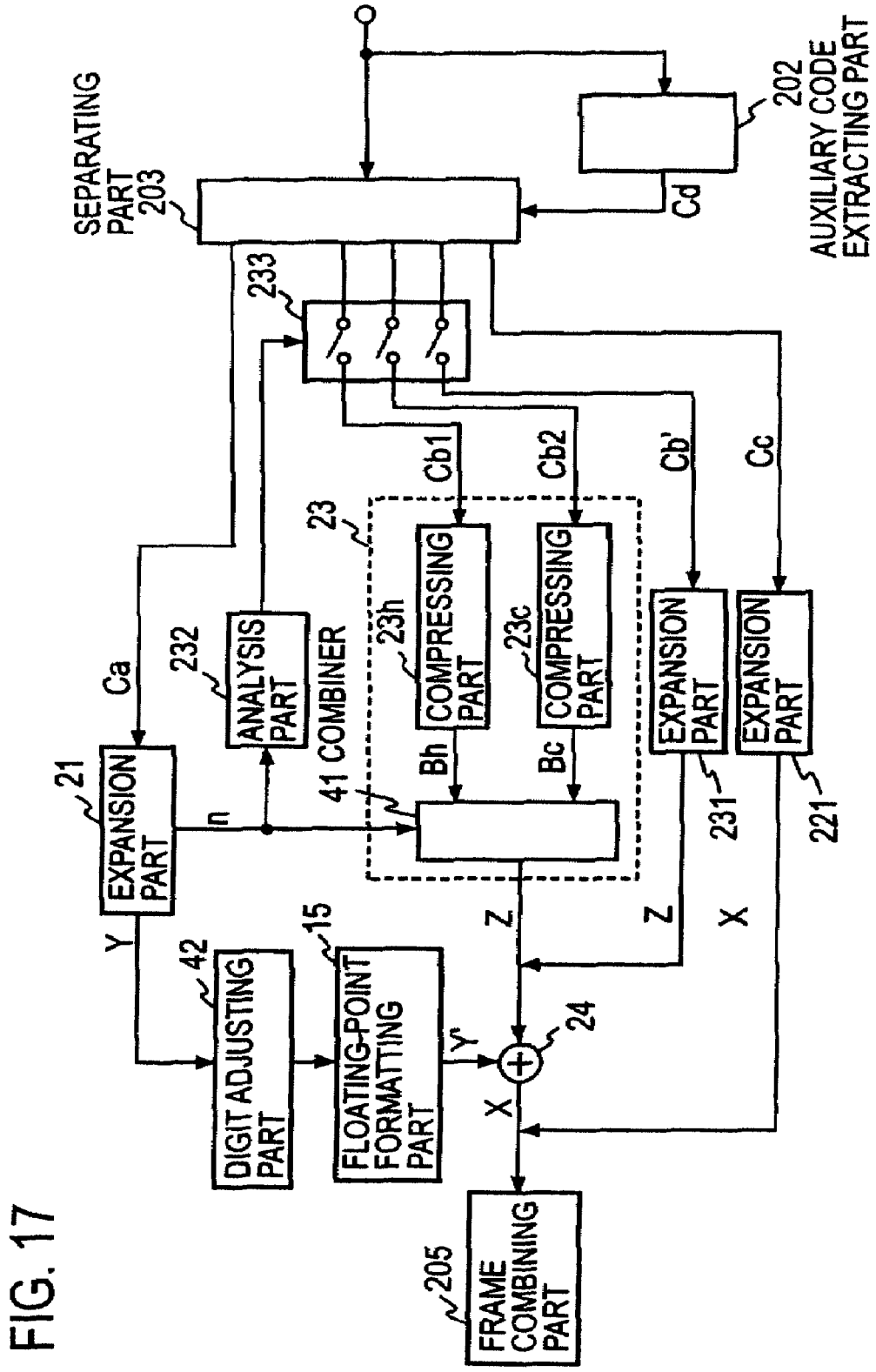
FIG. 17 is a functional diagram of a decoder according to a fourth embodiment of the present invention.

FIG. 17 shows an embodiment of a decoder associated with the coder shown in FIG. 16, whose parts corresponding to those of the decoder shown in FIG. 13 are denoted by the same reference numerals. In the case where a separating part 203 outputs code sequences Ca, Cb1 and Cb2 according to an auxiliary code Cd received from an auxiliary code extracting part 202, an expansion part 21 losslessly expansion-decodes the code sequence Ca to reproduce the signal sample sequence Y in the 16-bit integer format. An expansion part 23 comprises two expanders 23h and 23c and a combiner 41. The code sequences Cb1 and Cb2 are losslessly expansion-decoded by the expanders 23h and 23c, respectively, and the resulting bit sequences Bh and Bc are input to the combiner 41. The combiner 41 receives also the number of bits n following the most significant "1" in the integer part of each sample decoded by the expansion part 21. In the case where n≠0, h (=15−n) bits are extracted from the bit sequence Bh output from the expander 23h, 8 bits are extracted from the bit sequence Bc output from the expander 23c, and the h bits and the 8 bits are combined to constitute the least significant h bits and the most significant 8 bits of the mantissa M, respectively. For the following samples, similarly, depending on the number of digits n, h bits are extracted from the bit sequence Bh, 8 bits are extracted from the bit sequence Bc, and the extracted bits are combined. In the case where n=0, 8 bits as the exponent E and 15 (=23−8) bits are extracted from the bit sequence Bh, and 8 bits are extracted form the bit sequence Bc. The 8 bits extracted from the bit sequence Bc are inserted at the top of the 15 bits from the bit sequence Bh, thereby forming the 23-bit mantissa.

A digit adjusting part 42 inserts 8 bits of "0" at the bottom of the decoded signal sample Y in the 16-bit integer format to shift the signal sample Y by 8 bits toward the most significant bit position, thereby producing a signal sample in the 24-bit integer format. Then, a floating point formatting part 15 converts the signal sample into a signal sample sequence Y' in the 32-bit floating-point format. A combining part 24 combines the signal sample sequence Y' and the difference signal Z to reproduce a signal sample sequence X in the floating-point format. In the case where the separating part 203 outputs a code sequence Cc according to the auxiliary code Cd, an expansion part 221 decodes the code sequence Cc, thereby directly reproducing the signal sample sequence X.

In the above description, the signal sample sequence Y in the integer format is a 16-bit sample or a 24-bit sample. However, the number of bits contained in the signal sample Y may be any number m equal to or less than 24, and depending on the value of m, the number of digits capable of assuming non-zero in each signal sample Y in the integer format can be determined. Furthermore, in the example described above, a sequence of input signal samples X in the floating-point format may be divided into frames of 1024 samples, for example, or into blocks of consecutive samples, and compression coding may be performed for each of such divisional units. In the case where compression coding is performed on a divisional-unit basis, the number of bits converted into the integer format may be suitably determined for each divisional unit, and an auxiliary code that specifies that number of bits may be output.

As the compressing part 17 in the coder shown in FIG. 16, the compressing part 17 in the first embodiment shown in FIG. 1 may be used, and as the expansion part 23 in the decoder shown in FIG. 17, the expansion part 23 shown in FIG. 7 may be used. In such a case, the coder performs 16-bit integer formatting. However, the difference signal Z is not divided into a part containing bits "0" and a part containing bits capable of assuming non-zero, and only the least significant h (=23−n) bits of the mantissa are coded as described with reference to FIG. 6. Thus, the expansion part 23 in the decoder decodes the code sequence Cb to reproduce the h bits, and inserts n bits of "0" at the top of the h bits to produce the mantissa.

Fifth Embodiment

In the embodiments described above with reference to FIGS. 1, 8, 9, 11 and 12, for example, the compressing part 17 may be configured to perform for each frame the lossless compression coding on bit sequences extracted from the difference signal Z along the time-axis direction. In the following, such a coding method will be described with reference to FIG. 18.

FIG. 18 shows a case where one frame is composed of 1024 samples. In addition, for each sample number i (i=0 to 1023), there are shown an integer value of the n-bit integer part of the mantissa M of the sample in the input signal sample sequence X (n=E−E$_0$) and a bit sequence of the h-bit fractional part thereof (h=23−n). As described in the first embodiment with reference to FIG. 6, the most significant n bits of the integer part of the mantissa M of each difference signal sample Z are all "0", and the least significant h (=23−n) bits of the fractional part are bits that can be non-zero. In the coding method shown in FIG. 18, the least significant h bits of the mantissas of the difference signals are arrayed with their respective most significant bits MSB aligned with each other, the bits, each of which is located at a bit position j along the amplitude direction in each sample, are extracted in the time-axis direction to form a bit sequence $E_j$, and the bit sequence $E_j$ is coded.

The bit length h (=23−n) of the fractional part varies with the sample. Thus, in scanning the bits at the bit position j (j=0 to $h_{max}$−1; $h_{max}$ represents the maximum bit length of the fractional part of the samples in the relevant frame) along the amplitude direction in the time-axis direction, if a sample that has no bit at the bit position j is encountered, the sample is skipped. Whether to skip a sample i or not can be determined as follows: at the bit position j along the amplitude direction of the sample i, the bit length h of the fractional part of the sample is compared with the value j, and if h≧j, the bit at the bit position is extracted, and if h<j, the sample is skipped, and the same determination concerning the next sample (i+1) is made.

For example, in the scanning, in the time-axis direction, of bits at the bit position j=17 from the MSB, the sample i=0, whose bit length h of the fractional part is 23−6=17, has the least significant bit at the bit position j. However, the sample i=1, whose bit length of the fractional part is 23−8=15, has no bits following the 15th MSB (or bit position j=14). Thus, the sample i=1 is skipped. The extracted 15th bits are grouped for the frame to form a bit sequence E16, and the bit sequence E16 is entropy-coded. The same process is performed for each of the other bit positions j. As the entropy coding, arithmetic coding or Golomb coding is advantageous because layering can be provided.

On the decoder side, the number of digits n of the integer part can be determined from the number of bits n following the most significant "1" in each decoded integer-value signal sample Y, and therefore, the bit length h (=23−n) of the fractional part of the mantissa of each difference signal Z in the frame can be determined. Thus, for each of the decoded bit sequences $E_j$, the bits for the samples i in the frame are scanned sequentially, and the bit position j along the amplitude direction is compared with the bit length h for each sample. If $j \leq h$, the fractional part of the mantissa shown in FIG. 18 can be reproduced by allocating the value of the bit in the bit sequence $E_j$ to the bit position (i, j). Then, at the top of the fractional part of each sample, n bits of "0" associated with the sample can be added, thereby reproducing the 23-bit mantissa M of the difference signal.

Figure 19:
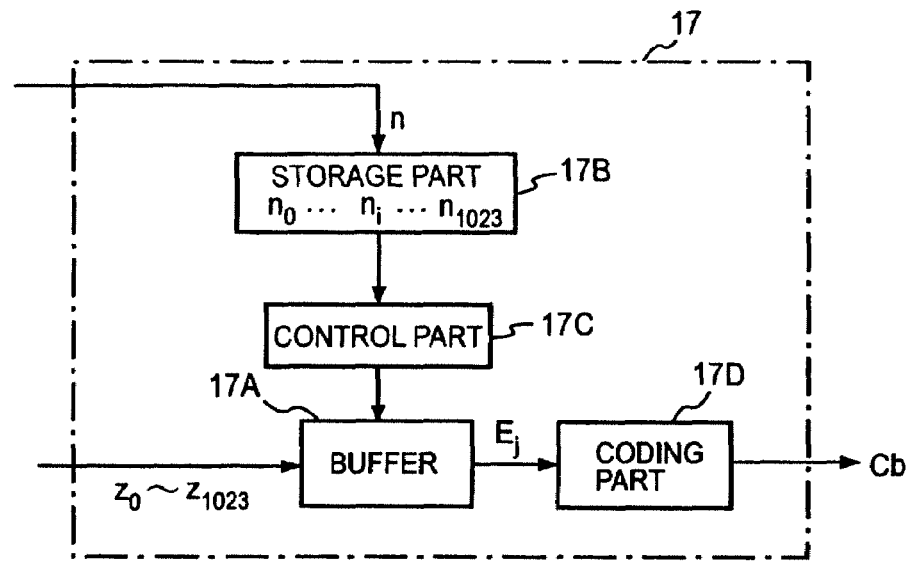
FIG. 19 shows a configuration of a compressing part 17 that performs the coding shown in FIG. 18.

FIG. 19 shows a functional configuration of the compression-coding part 17 shown in FIGS. 1, 8, 9, 11 and 12 to which the coding method shown in FIG. 18 is applied. The compression-coding part 17 receives one frame of samples $z_0$–$z_{1023}$ of the difference signal Z from the difference producing part 14 (see FIG. 1, for example) and stores the numbers of digits $n_0$–$n_{1023}$ of their respective integer parts thereof in a storage part 17B. Based on the number of digits $n_i$ of each sample i, a control part 17C places h-bit integer part (h=23−n) of the mantissa of the input difference signal $Z_i$ excluding the most significant n bits in a buffer 17A. Thus, the array of the integer parts of the mantissas as shown in FIG. 18 is obtained. Then, the control part 17C scans, in the time-axis direction, the samples at the bit position j (=0 to $h_{max}$−1) along the amplitude direction, extracts the bits for which the relation of $h \geq j$ is satisfied to form a bit sequence $E_j$, and supplies the bit sequence $E_j$ to a compressing part 17D. The buffer 17A, the storage part 17B and the control part 17C constitute bit sequence producing means. The compressing part 17D losslessly compression-codes the bit sequence $E_j$ and outputs a code Cb.

Figure 20:
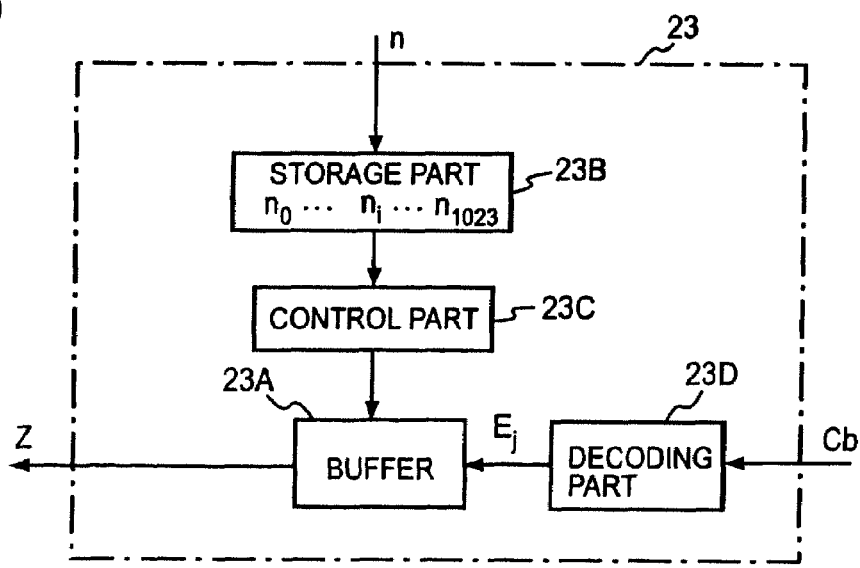
FIG. 20 shows a configuration of an expansion part 23 in a decoder that can decode the coding shown in FIG. 19.

FIG. 20 shows a functional configuration of the expansion part 23 shown in FIGS. 7, 10 and 13 serving as difference signal decoding means that is associated with the compression-coding part 17 shown in FIG. 19. A decoding part 23D decodes the received code Cb to reproduce the bit sequence $E_j$. On the other hand, the numbers of digits $n_0$–$n_{1023}$ of the integer parts for one frame, which are received from the digit calculating part 21A (see FIG. 7, for example), are stored in a storage part 23B, and a control part 23C allocates one bit extracted from the bit sequence $E_j$ to each bit position (i, j) for which the relationship of $h_i \geq j$ concerning the number of digits $h_i$ (=23−$n_i$) of the fractional part of each sample i is satisfied, and stores the resulting bit arrangement in a buffer 23A, and repeats the same process for all the samples, thereby reproducing the fractional-part bit array shown in FIG. 18. Once the bit arrangement of all the bit sequences $E_j$ (j=0 to $h_{max}$−1) for one frame is completed, the control part 23C adds $n_i$ bits of "0" at the top of the fractional part of each sample i in the buffer 23A to reproduce the mantissa of the difference signal, and supplies the difference signal Z to the combining part 24 (FIG. 7). The buffer 23A, the storage part 23B and the control part 23C constitute reconstructing means.

In the coding of the mantissa of the difference signal shown in FIG. 18, bits at a bit position j are grouped along the time-axis direction into a bit sequence $E_j$, and the bit sequence $E_j$ is coded. In the following, another method of scanning bit positions will be described. In FIG. 21, bits are scanned and collected, in the frame direction, continuously over a predetermined bit length along the amplitude direction in such a manner that the first of the bits at the bit position j+1 follows the last of the bits at the bit position j, thereby producing a plurality of bit sequences $E_{2'}$, $E_{18'}$ and so on. Thus, the number of bit sequences $E_j$ is less than the maximum number of bits $h_{max}$ of the fractional part. In this bit scanning, again, any bit position for which the relationship $h_i$<j is satisfied is skipped. In the case of this bit scanning method, again, the number of digits of the fractional part of each sample i can be determined according to $h_i$=23−$n_i$. Thus, on the decoder side, the bit arrangement of the fractional part can be reproduced by allocating the bits in the bits sequences $E_j$ in the same manner as described above.

FIG. 22 shows another bit scanning method. According to the method shown in FIG. 21, continuous bit scanning in the frame direction over a length of plural bits along the amplitude direction is performed in such a manner that the first of the bits at the bit position j+1 follows the last of the bits at the bit position j. However, according to the method shown in FIG. 22, bits of a sample i are scanned, beginning with the MSB thereof, in the amplitude direction over the length of plural bits, such that the last bit in the length of plural bits in the sample i is followed by the first bit in the length of plural bits in a sample i+1. Such scanning is repeated until the last sample in the frame is reached. In this example also, any bit position for which the condition $h_i$<j is satisfied is skipped.

FIG. 23 is a diagram for illustrating an exceptional operation in the bit scanning shown in FIG. 18. In the case where truncation makes the integer part 0, that is, in the case where the value of E−$E_0$ is negative, all the 32 bits including the exponent have to be coded and transmitted. Thus, as shown in FIG. 23, in the case where the integer part of the sample i=3 is 0 (that is, n=0), the compressing part 17 shown in FIG. 1 leaves the sample i=3 out of the bit scanning of the mantissas and codes the sample i=3 separately.

In the case where the input signal sample sequence X is a signal sample sequence in the floating-point format that is converted from the integer format, and the number of digits of the original integer value differs from the number of digits of the truncated integer value, that is, in the case where a signal sample sequence in the floating-point format directly converted from a 24-bit integer-value signal sample sequence is coded into a 16-bit integer-value signal sample sequence through truncation as described with reference to FIGS. 14B and 15B, the most significant 8 bits of the fractional part of the mantissa of the difference signal can be non-zero, although the remaining bits are 0. If such an input signal sample sequence X is coded by the method shown in FIG. 13, for example, the bit sequences $E_0$ to $E_7$ can be non-zero, although the following bit sequences $E_8$ to $E_{21}$ are all "0", so that efficient coding can be achieved. It will be readily understood that efficient coding can be achieved similarly if the methods shown in FIGS. 21 and 22 are used.

As is performed in the audio signal processing as required, for example, if a 24-bit integer-value signal sample is increased 1.5-fold (or 1.1-fold in binary notation), the resulting signal sample is converted into a signal in the floating-point format, and the resulting signal is coded into a 16-bit integer-value signal through truncation, increasing the 24-bit integer-value signal sample 1.5-fold makes at least the first decimal place be a bit that can be non-zero. Specifically, the first place following the decimal point $P_D$ in the mantissa $M_X$ of the sample X shown in FIG. 14B can be non-zero. Therefore, the bits of the mantissa $M_Z$ of the difference signal that can be non-zero increases toward the least significant bit position by 1 bit to 9 bits. In this case also, the bits following the 9 bits are all "0", so that efficient coding can be achieved using the methods shown in FIGS. 18, 21, 22 and 23. Besides, if all the bits are not 0, the frequency of occurrence of non-zero (that is, "1") may vary with the digit place, and in such a case, the lossless coding can be applied suitably for the variation.

In any case, the numbers of digits capable of assuming non-zero in the fractional part of the mantissa of the difference signals counted from the side of the MSB are equal, so that efficient compression coding can be achieved.

The mantissa coding methods shown in FIGS. 18 to 23 have been described on the assumption that the methods are applied to the first embodiment shown in FIG. 1. However, the methods can be applied to a case where a 16-bit integer value is formed through truncation as described with reference to FIGS. 14A to 17. In such a case, the compressing part 17 shown in FIG. 16 is reconfigured as shown in FIG. 19, and the expansion part 23 shown in FIG. 17 is reconfigured as shown in FIG. 20.

In addition, the samples can be rearranged for scanning based on the number of digits of the fractional part. For example, the samples whose fractional part is composed of 23 digits are grouped together, the samples whose fractional part is composed of 22 digits are then grouped together, and samples having fractional parts composed of less numbers of digits are grouped together in the same way. The reverse arrangement of the samples can be achieved in a unique manner without the need of any additional information, so that the number of samples to be scanned can be simply managed.

In the example shown in FIG. 18, a bit sequence $E_j$ is produced by scanning, in the time-axis direction, bits capable of assuming non-zero in the mantissa M of the samples z of difference signal Z in each frame, each sample containing h bits capable of assuming non-zero, with the MSB of the h bits of each sample aligned with the MSBs of the other samples. However, as shown in FIG. 24, similar scanning can be performed with the LSB of the h bits capable of assuming non-zero of each sample aligned with the LSBs of the other samples. In this case, the compression-coding part 17 can be configured the same as that shown in FIG. 19, and only the manner in which the control part controls the scanning is modified. In addition, the expansion-decoding part 23 in the decoder can be configured the same as that shown in FIG. 20.

Sixth Embodiment

Figure 25:
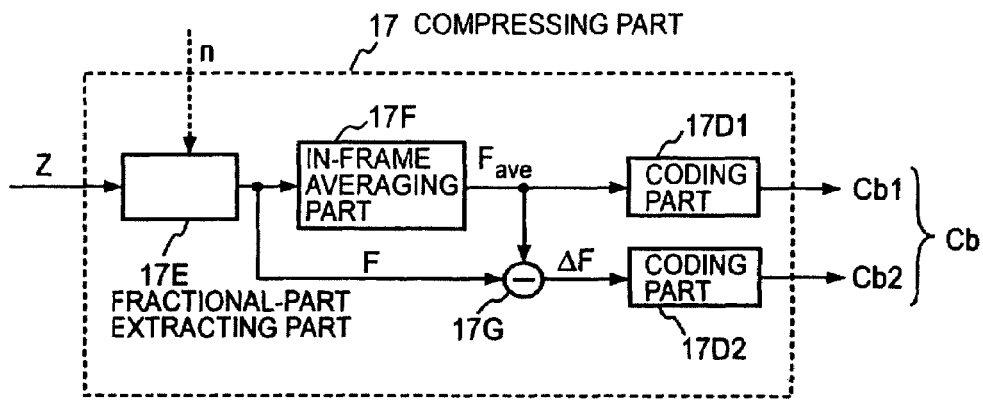
FIG. 25 shows a configuration of a compressing part 17 in a coder according to a sixth embodiment of the present invention.

FIG. 25 shows another embodiment of the compressing part 17 in the coder shown in FIGS. 1, 8, 9, 11 and 12 described above. In this embodiment, an integer-value sample sequence is formed by arranging the fractional parts containing bits capable of assuming non-zero with the LSBs thereof aligned with each other, and compression coding is performed by eliminating the redundancy in the sample-sequence direction. As shown in FIG. 25, the compression-coding part 17 comprises a fractional-part extracting part 17E, an in-frame averaging part 17F, a subtracter 17G and coding parts 17D1 and 17D2. The fractional-part extracting part 17E extracts, as one integer-value sample F, the fractional part composed of the least significant h bits (h=23−n) of the mantissa M of each difference signal sample Z received from the difference producing part 14. The in-frame averaging part 17F calculates the average $F_{ave}$ of the extracted integer-value samples for each frame, and the coding part 17D1 codes the average $F_{ave}$ and outputs the resulting code sequence Cb1. The subtracter 17G determines the difference between the average $F_{ave}$ and each integer-value sample F as an error sample ΔF, and the coding part 17D2 predictive-codes the error sample ΔF, losslessly compression-codes a prediction error and outputs the resulting code sequence Cb2. The predictive parameter may be separately transmitted as auxiliary information, or may be adaptively updated with the consistency being kept between the coder and the decoder.

Figure 26:
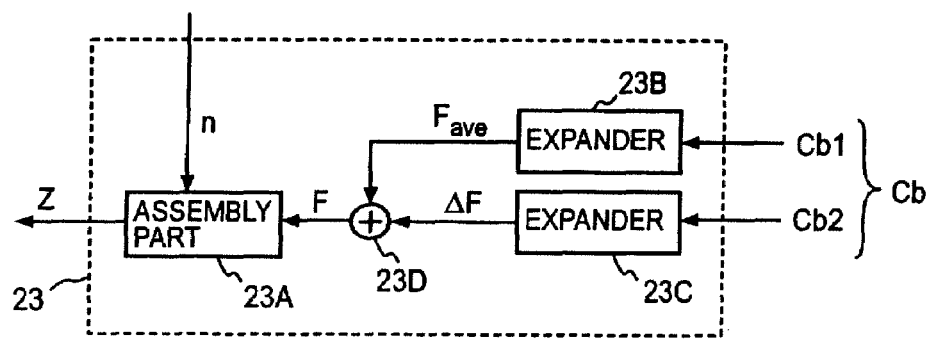
FIG. 26 shows a configuration of an expansion part 23 in a decoder according to the sixth embodiment of the present invention.

FIG. 26 shows a configuration of a decoding and expanding part 23 in a decoder associated with the coder shown in FIG. 25. This configuration can be applied to the expansion part 23 in the decoder shown in FIG. 7, 10 or 13. According to this embodiment, the expansion part 23 comprises expanders 23B and 23C, an adder 23D and an assembly part 23A. The expander 23B expansion-decodes the received code sequence Cb1 and outputs the average $F_{ave}$ for each frame. The expander 23C expansion-decodes the received code sequence Cb2 to determine the prediction error, performs predictive decoding and outputs the error sample ΔF. The adder 23D sums the average $F_{ave}$ and the error sample ΔF to reproduce the integer-value sample F. The assembly part 23A assembles the difference signal Z from the integer-value sample F using the number of digits n from the digit calculating part 21A.

This embodiment can be applied to the embodiment shown in FIGS. 16 and 17, if the compression-coding part 17 shown in FIG. 16 and the expansion part 23 shown in FIG. 17 are replaced with the compression-coding part 17 shown in FIG. 25 and the expansion part 23 shown in FIG. 26, respectively.

Seventh Embodiment

Figure 27:
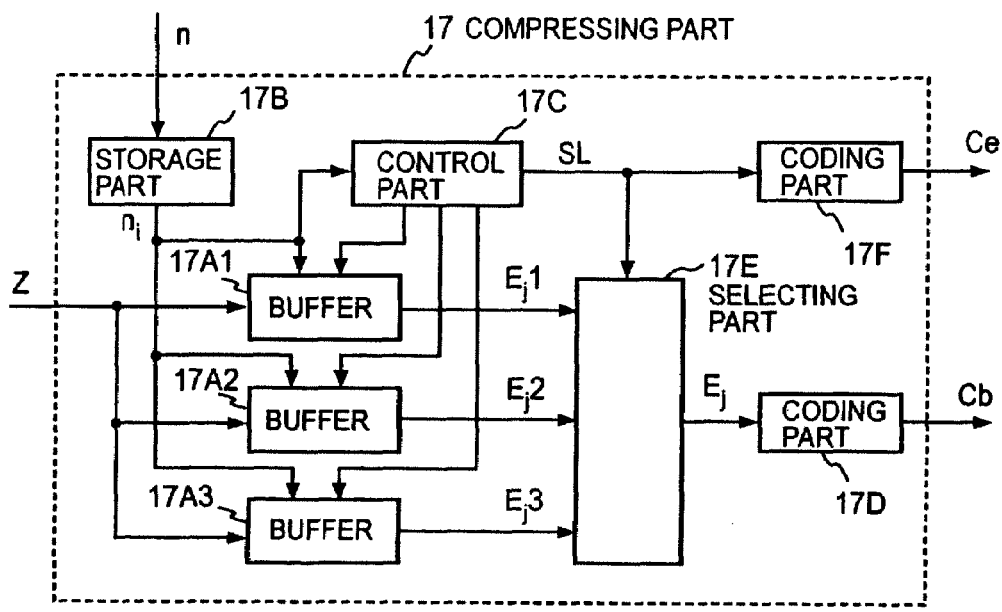
FIG. 27 shows a configuration of a compressing part 17 in a coder according to a seventh embodiment of the present invention.

FIG. 27 shows a configuration of a compressing part according to a seventh embodiment, which is applied to the compressing part 17 shown in FIGS. 1, 8, 9, 11 and 12. FIGS. 18 to 23 show methods of coding a bit sequence produced by scanning an array of bits capable of assuming non-zero along with various methods of scanning. However, according to the seventh embodiment, an optimal one of the plural scanning methods is selected to code the output bit sequence.

As in the case shown in FIG. 19, a storage part 17B stores the numbers of digits n ($n_0$, $n_1$, $n_2$, . . . , $n_{1023}$) for difference signal samples received from an integer formatting part 12 (see FIG. 1, for example). Then, under the control of a control part 17C, the least significant h (=23−n) bits, which can be non-zero in the mantissas M of the difference signals Z are stored in buffers 17A1, 17A2 and 17A3. In each of the buffers, the bits are stored with the MSB of each difference signal Z aligned with the MSBs of the other difference signals Z, as shown in FIG. 18, for example. Under the control of the control part 17C, the bits in the bit array stored in the buffer 17A1 are scanned in the time-axis direction for each bit position along the amplitude direction to produce a bit sequence $E_j1$, as shown in FIG. 18. The bits in the bit array stored in the buffer 17A2 are scanned in the time-axis direction within each of predetermined bit lengths along the amplitude direction to produce a bit sequence $E_j2$, as shown in FIG. 21, for example. The bits in the bit array stored in the buffer 17A3 are scanned in the in the amplitude direction within each predetermined bit length along the amplitude direction of each sample to produce a bit sequence $E_j3$.

For each frame, the control part 17C determines the deviation of values of bits in each of the bit sequences Ej produced by the scanning methods in terms of count of "1"s for example, determines the degree of deviation of bits "1" for each scanning method, determines which of the scanning methods provides the highest degree of deviation (or the lowest entropy), and then supplies, to a selecting part 17E, a selection signal SL that designates the bit sequence $E_j$ in the buffer corresponding to the scanning method of the highest degree of deviation. The selected bit sequence is coded in a coding part 17D, and the resulting code sequence Cb is output.

The entropy corresponding to the deviation of bits "1" in a frame is represented by the following formula:

$$\Sigma_j -m_j((k_j/m_j)\log_2(k_j/m_j)+(1-(k_j/m_j))\log_2(1-(k_j/m_j))) \quad (2)$$

where "$m_j$" denotes the number of bits in each bit sequence $E_j$, and "k" denotes the number of "1"s in the bit sequence. "$\Sigma_j$" means a sum for all the possible "j" values (that is, the number of bit sequences). As the deviation of bits "1" increases, the entropy decreases. The entropy depends on how the bit array for the frame is scanned or how the bit array is divided into bit sequences. Thus, according to the seventh embodiment, the optimal scanning method for the bits capable of assuming non-zero is selected for each frame.

Figure 28:
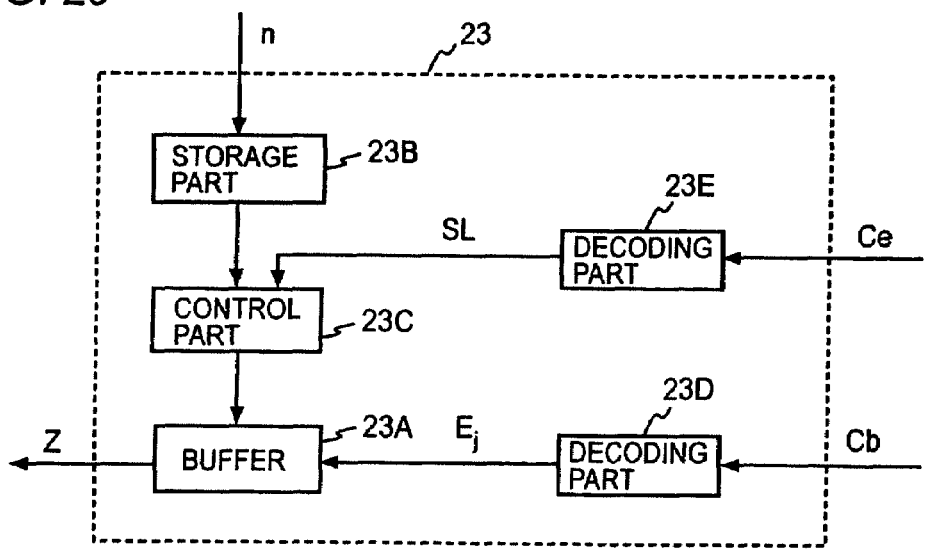
FIG. 28 shows a configuration of an expansion part 23 in a decoder according to the seventh embodiment of the present invention.

FIG. 28 shows a configuration of the expansion part 23 shown in FIGS. 7, 10 and 13 that is adapted for the compressing part 17 shown in FIG. 27. The expansion part 23 is configured the same as the expansion part 23 shown in FIG. 20 except that a decoding part 23E is additionally provided. The decoding part 23E decodes an auxiliary code Ce to reproduce the selection signal SL and supplies the selection signal SL to a control part 23C. Based on the scanning method and the number of digits that correspond to the supplied control signal, the control part 23C stores the bit sequence $E_j$ output from a decoding part 23D into a buffer 23A in such a manner that the sequences of bits capable of assuming non-zero for the respective samples are reproduced. Then, $n_j$ bits of "0" are added at the top of the $h_j$ bits capable of assuming non-zero of each sample to form the mantissa M, and the mantissa M is output as the difference signal Z.

Figure 29:
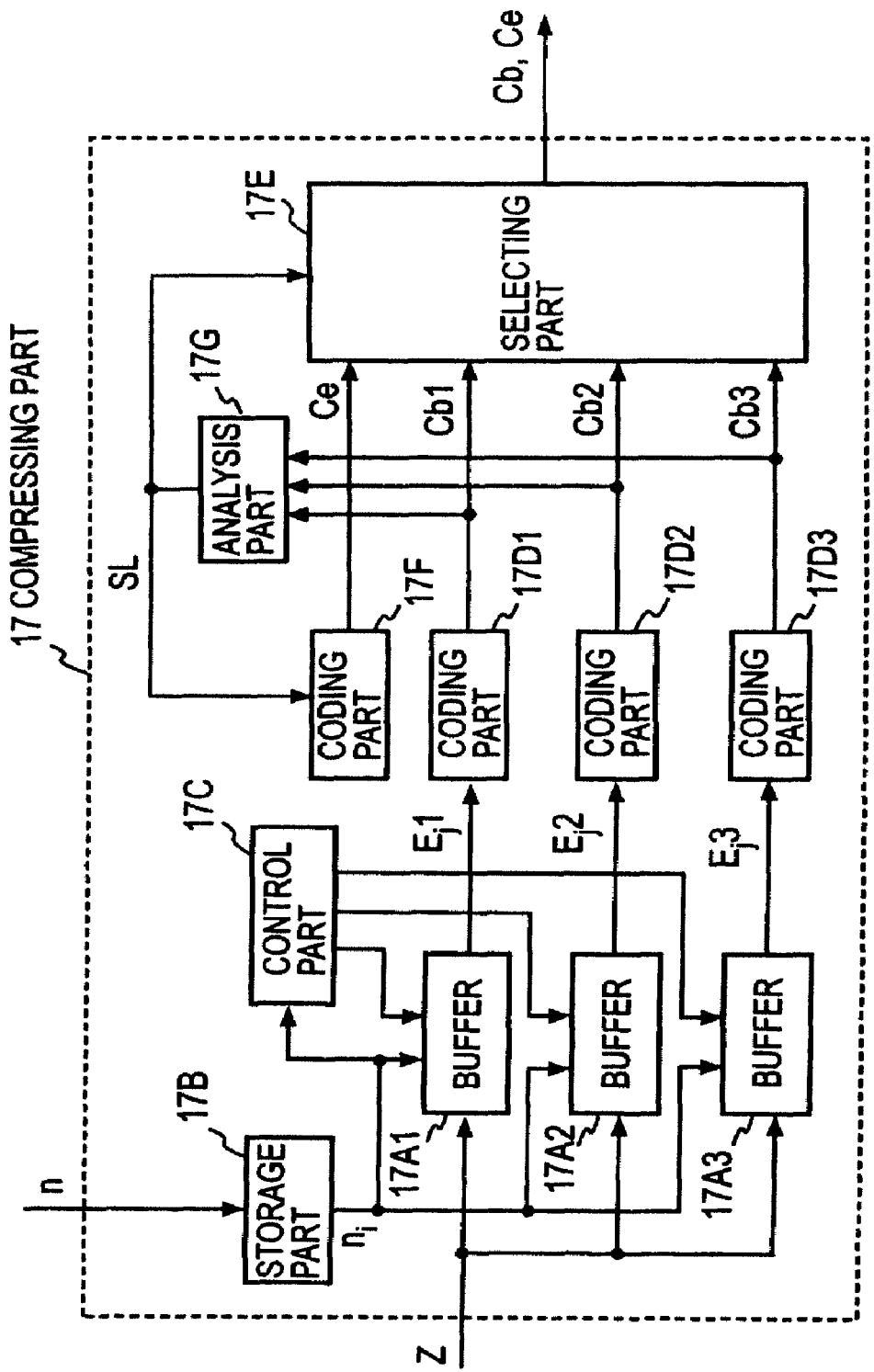
FIG. 29 is a diagram showing a modification of the compressing part 17 shown in FIG. 27.

FIG. 29 shows a modification of the compressing part shown in FIG. 27, in which bit sequences $E_j1$, $E_j2$ and $E_j3$ from buffers 17A1, 17A2 and 17A3 are coded by coding parts 17D1, 17D2 and 17D3, respectively. An analysis part 17G determines which of the output codes is of the smallest quantity of information, and supplies a selection signal SL designating the output code not only to a selecting part 17F but also to a coding part 17E to obtain a code Ce. The selecting part 17E outputs the code sequence of the smallest quantity of information designated by the selection signal as a code sequence Cb, along with the code Ce. As an expansion part 23 in the decoder associated with the compressing part 17 shown in FIG. 29, the expansion part 23 shown in FIG. 28 can be used as it is.

Figure 30:
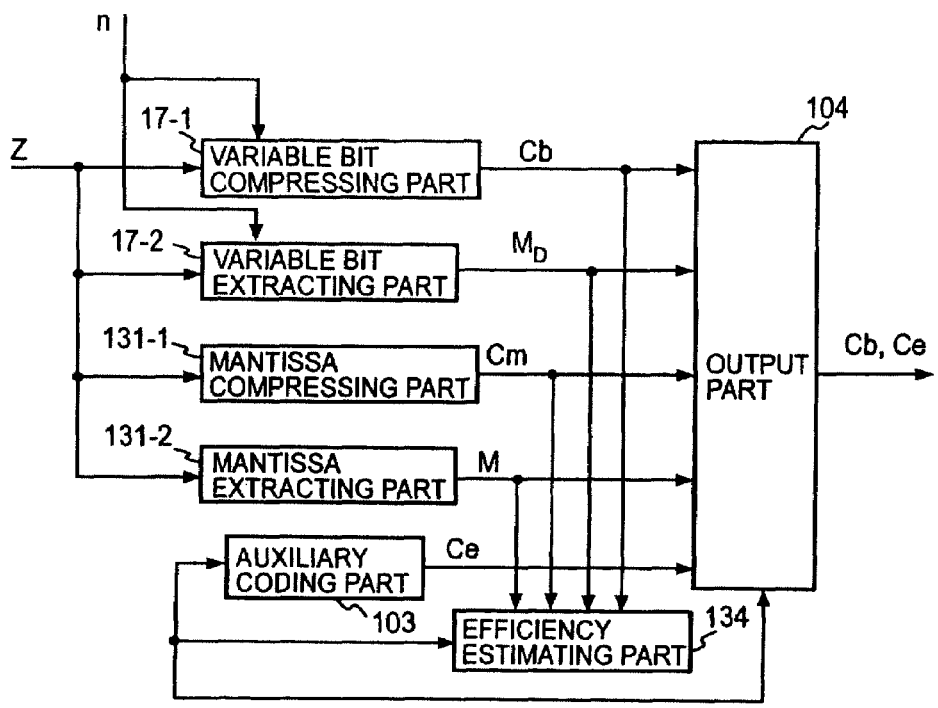
FIG. 30 shows a mechanism that can be used instead of compressing parts 17 and 131 in the coder shown in FIG. 11.

Instead of the compressing parts 17 and 131 shown in FIG. 11, a configuration shown in FIG. 30 can be used. The configuration comprises a variable bit compressing part 17-1, a variable bit extracting part 17-2, a mantissa compressing part 131-1 and a mantissa extracting part 131-2. The variable bit compressing part 17-1 extracts and compression-codes h (=23−n) bits (variable bits) capable of assuming non-zero from the mantissa M of the difference signal Z based on the number of digits n and outputs a code Cb. The variable bit extracting part 17-2 extracts a bit sequence $M_D$ containing h bits capable of assuming non-zero from the mantissa M of the difference signal Z and outputs the bit sequence without processing. The mantissa extracting part 131-1 compression-codes the mantissa M of the difference signal Z and outputs a code Cm. The mantissa extracting part 131-2 extracts the mantissa M of the difference signal Z and outputs the mantissa M without processing. An efficiency estimating part 134 calculates the quantity of information of each of Cb, $M_D$, Cm, M and Z, and determines one of them which is of the smallest quantity of information. The selection signal SL designating the determined one is coded by an auxiliary coding part 103, and the resulting code Ce is supplied to an output part 104. The output part 104 selects one of Cb, $M_D$, Cm, M and Z which is designated by the selection signal SL and outputs the one as the code Cb along with the code Ce.

Figure 31:
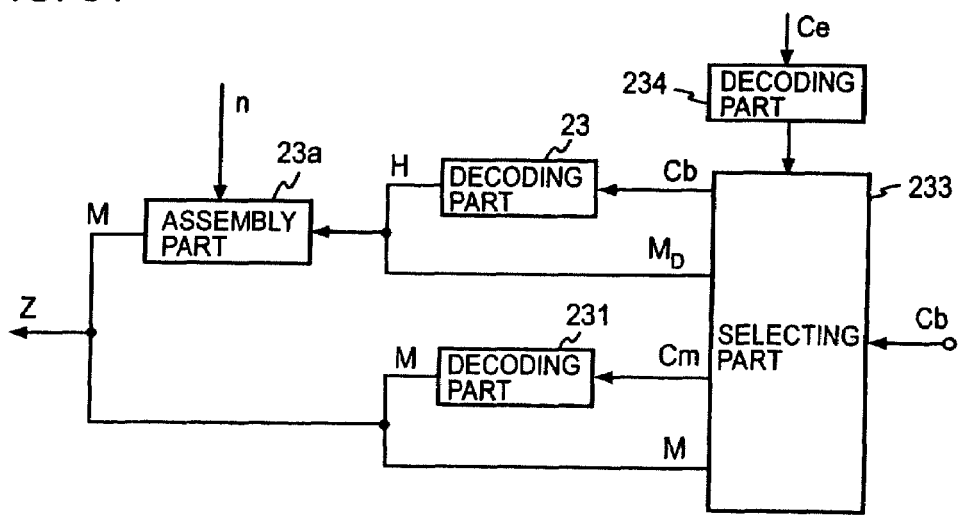
FIG. 31 shows a mechanism with which expansion parts 23 and 231, selecting part 233 and auxiliary decoding part 234 in the decoder shown in FIG. 10 are replaced in order to make the decoder suitable for the coder incorporating the mechanism shown in FIG. 30.

FIG. 31 shows a configuration that is associated with the configuration shown in FIG. 30 and can be used instead of the expansion parts 23 and 231, the selecting part 233 and the auxiliary decoding part 234 in the decoder shown in FIG. 10. Here, the analysis part 232 is not necessary. In FIG. 31, a decoding part 234 decodes the code Ce into the selection signal SL, and based on the selection signal SL, a selecting part 233 is controlled. Specifically, depending on the selection signal SL, as the input code Cb, the compression code Cb of the variable bit sequence is supplied to a decoding part 23, the variable bit sequence (the sequence of bits capable of assuming non-zero) $M_D$ is supplied to an assembly part 23a, the compression code Cm of the mantissa M is supplied to a decoding part 231, or the mantissa M is output as it is. The decoding part 23 decodes the code sequence Cb to produce the bit sequence $M_D$ composed of bits capable of assuming non-zero and supplies the bit sequence $M_D$ to the assembly part 23a. Based on the number of digits n, the assembly part 23a adds n bits of "0" at the top of the bit sequence $M_D$ to reproduce the mantissa M.

MODIFIED EXAMPLE

Figure 32:
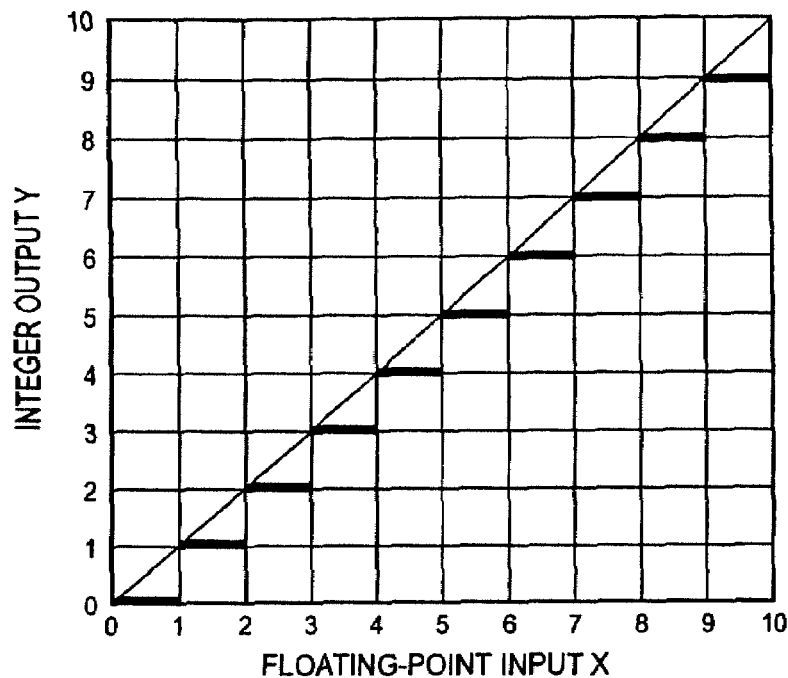
FIG. 32 shows a relationship between a floating-point input and an integer value resulting from truncation of the floating-point input.
Figure 33:
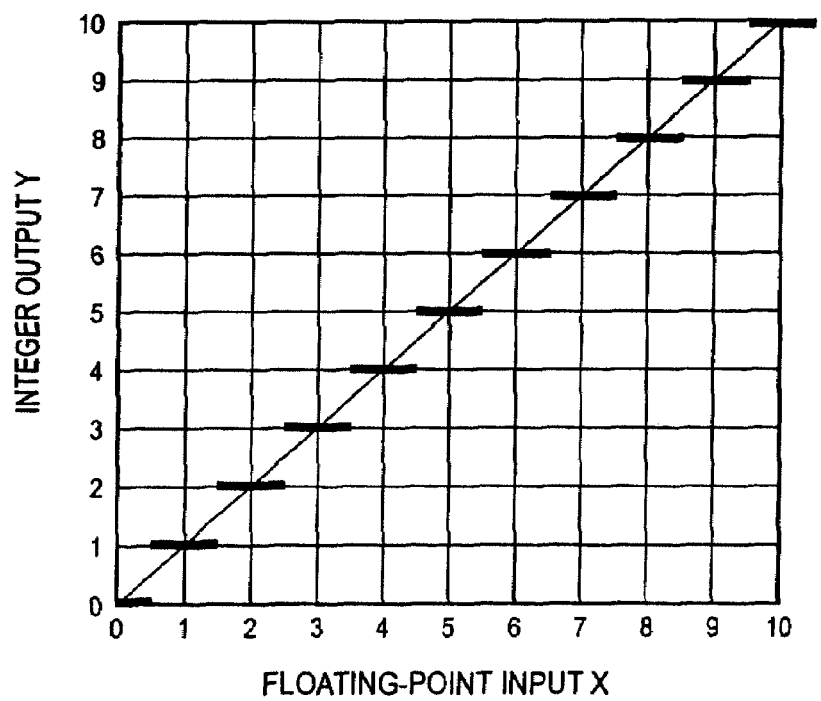
FIG. 33 shows a relationship between a floating-point input and an integer value resulting from rounding of the floating-point input.

In FIG. 5, each sample in the input floating-point signal sample sequence X is converted into an integer value by truncation, that is, in such a manner that the absolute value of the integer value is as small as possible. However, provided that the exponent of each sample in the floating-point signal sample sequence Y' resulting from the conversion by the floating point formatting part 15 is made equal to the exponent of the corresponding sample in the input floating-point signal sample sequence X, rounding can be used instead of truncation. As shown in FIG. 32, the truncation changes the input floating-point values that continuously vary from 0 to 1, from 1 to 2, . . . , and from 8 to 9 into integer values of 0, 1, 2, . . . , and 9, respectively. Therefore, the error signal produced by subtracting the integer value from the input floating-point value, that is, the mantissa of the difference signal Z is always positive. On the other hand, as shown in FIG. 33, the rounding changes the input floating-point values that continuously vary from 0 to 0.5, from 0.5 to 1.5, from 1.5 to 2.5, . . . , and from 8.5 to 9.5 into integer values of 0, 1, 2, . . . , and 9, respectively. Therefore, the error signal produced by subtracting the floating-point value converted again from the integer value from the input floating-point value, that is, the difference signal Z can be negative. In the integer formatting, if round-up occurs in the value of a power of 2, the exponent of each sample in the floating-point digital signal sample sequence Y' converted again from the integer-value sample sequence differs from that of the corresponding sample in the input floating-point digital signal sample sequence X, and the mantissa of each sample completely differs from that of the corresponding sample in the input floating-point signal sample sequence X. This is disadvantageous for compression.

Figure 34:
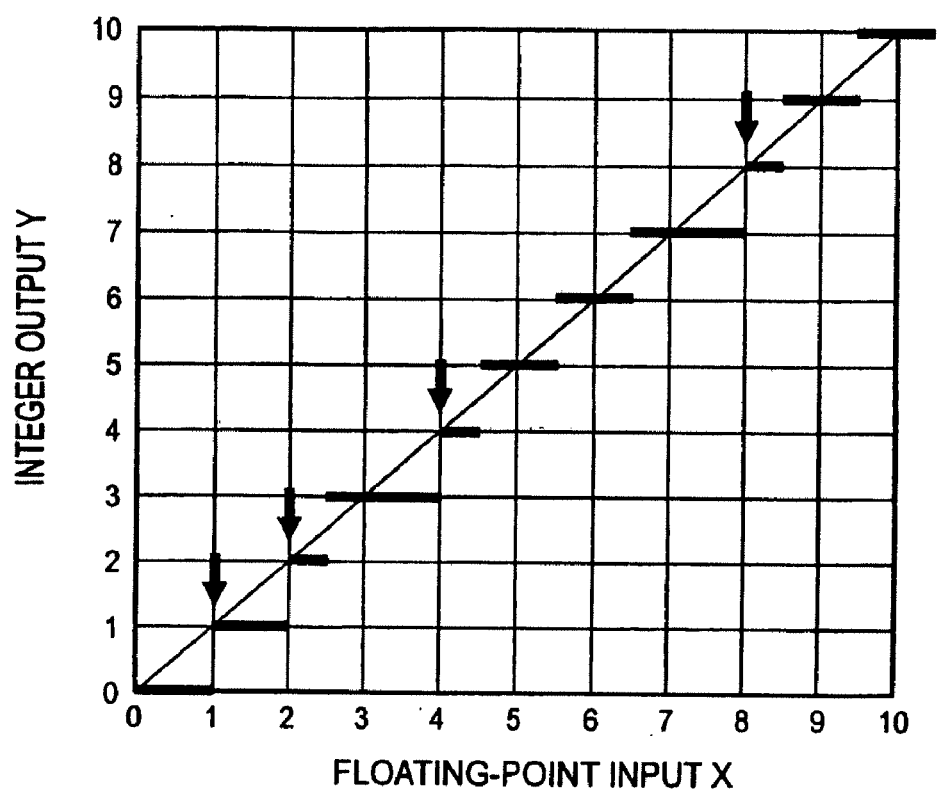
FIG. 34 shows a relationship between a floating-point input and an integer value resulting from a modified rounding of the floating-point input.

Thus, rounding is modified as described below. As shown in FIG. 34, input floating-point values that continuously vary from 0 to 1, from 1 to 2, from 2 to 2.5, from 2.5 to 4, from 4 to 4.5, from 4.5 to 5.5, from 5.5 to 6.5, from 6.5 to 8, from 8 to 9.5 and so on are changed into integer values of 0, 1, 2, 3, 4, 5, 6, 7, 8, 9 and so on, respectively. That is, as indicated by arrows in the drawing, if the n-bit integer part $M_1$ of the mantissa M assumes a value $2^n-1$, which precedes a power of 2, truncation, rather than rounding, is performed. Otherwise, rounding is performed. Although 1 bit is additionally required to indicates the sign that designates whether the error signal (difference signal) Z is positive or negative, the maximum number of digits of the mantissa is reduced by 1 bit, because the error of the rounded sample is equal to or less than 0.5. Thus, the number of digits of the mantissa including the sign bit is the same as in the case of truncation. However, when the integer part $M_1$ assumes a value of $2^n$, that is, a power of 2, the number of digits of the mantissa of the error can be reduced by 1, and when the integer part $M_1$ assumes a value of $2^n-1$, an error up to 1 occurs only if the error is positive. Thus, these two cases have to be handled specially.

That is, the sign bit is added at the top of the bits capable of assuming non-zero in each difference signal sample Z, a code designating the number of bits h capable of assuming non-zero is added to the bits and the resulting bit sequence is compression-coded if the integer part $M_1$ assumes a value of $2^n-1$, and the decoder decodes and expands the code sequence Cb and separates the resulting bit sequence into sub-sequences each containing a number of bits, the number of bits being a sum of the number of bits h capable of assuming non-zero determined from the number of bits n of the integer part and one bit of the sign bit. If the integer part $M_1$ assumes a value $2^n-1$, the sign bit, the number of bits of the code designating the number of bits h capable of assuming non-zero, and the number of bits h designated by the code are separated to determine one sample of difference signal Z. In the case where only the bits capable of assuming non-zero are coded, the efficiency increases as the amplitude increases. As the amplitude increases, the number of times that the integer part assumes a value of $2^n-1$, that is, the number of times of occurrence of the exceptional processing decreases, so that the compression efficiency can be improved in total.

Using the modified rounding described above can make the error energy between the floating-point input and the integer part lower than that in the case of using truncation, and thus, the prediction efficiency for the integer part sequence can be improved. In addition, because only the bits capable of assuming non-zero have to be coded, the efficiency of compression of the difference signal Z by the compressing part 17 can be improved.

For example, as shown by an alternate long and short dash line in FIG. 3, following the step S2, it is determined whether the integer part $M_1$ of the input floating-point signal sample sequence X is $2^n-1$ or not. For example, it is determined whether the most significant n $(=E-E_0)$ bits of the mantissa M are all "1" or not. If all the bits are "1", it means that the integer part $M_1$ assumes a value preceding a power of 2, the process continues to step S3, where truncation is performed. If the most significant $E-E_0$ bits are not all "1", the process continues to step S6, where the integer formatting through the modified rounding is performed.

Modified Embodiment

In the second embodiment shown in FIG. 9, based on the determination by the analysis part 132, a selection is made between compression coding by the compressing part 17 and compression coding by the compressing part 131. To achieve proper selection, as shown in FIG. 11, both the compressing parts 17 and 131 perform coding, and one of the resulting codes which is of higher compression efficiency is adopted. Although the compression coding by the compressing part 131 is accurate, the direct compression coding of the difference signal Z requires a relatively large processing quantity and processing time. Thus, the method described below may be used.

For example, as a method of estimating the efficiency of universal coding on a byte (8-bit) basis, there is a method of calculating the entropy for each byte. An error signal, that is, a difference signal Z in the floating-point format is regarded as an integer value y ranging from 0 to $2^8-1$ (=255) on an 8-bit basis, a histogram is created from the number of times of occurrence L(y) of the integer value y within one frame, and the number of times L(y) is divided by the number of bytes B in the frame to determine a density function p(y).

$$p(y)=L(y)/B \qquad (3)$$

From this density function p(y), an average entropy H(p(y)) is determined.

$$H(p(y)) = -\sum_{y=0}^{255} p(y)\log_2 p(y) \qquad (4)$$

The universal coding can possibly compress 1 byte of numeral value to about the size of the average entropy (bit). Thus, if the product of the average entropy value and the number of bytes B in the frame is smaller than the total number of bits in one frame resulting from compression coding of only the bits capable of assuming non-zero by the compressing part 17, the universal coding on a byte basis, that is, the compression coding by the compressing part 131, is more advantageous.

Figure 35:
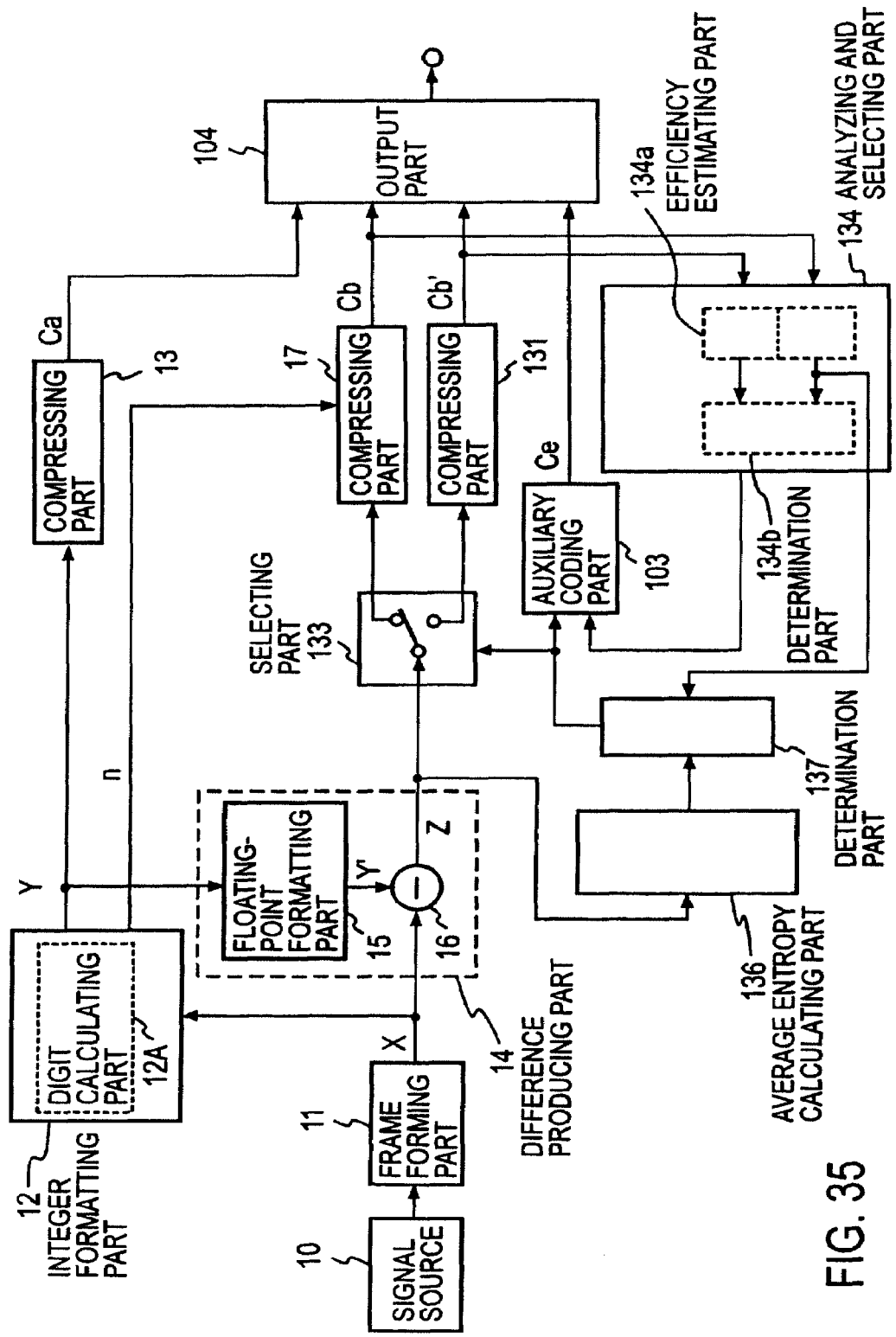
FIG. 35 shows a modification of the coder shown in FIG. 11.

A configuration of a coder that allows for such selection between compressing parts is shown in FIG. 35. The configuration of the coder shown in FIG. 35 is the configuration shown in FIG. 11 additionally provided with a selecting part 133, an average entropy calculating part 136 and a determination part 137. As shown in this drawing, a difference signal Z is input from a difference producing part 14 to the average entropy calculating part 136, the average entropy H(p(y)) is determined as described above, and the product of the average entropy H(p(y)) and the number of bytes B is determined. The determination part 137 compares the product with the number of bits of one frame of code sequence Cb' estimated by an efficiency estimating part 134a. If the former is smaller, the selecting part 133 is controlled so that the difference signal Z is compression-coded by the compressing part 131, or if the latter is smaller, the code sequence Cb' produced by the compressing part 17 through compression coding is output as the code sequence Cb. Also, an auxiliary code Ce indicating which compressing part is selected is outputted. Here, if an integer formatting part 12 performs integer formatting by truncation in the calculation of the entropy, the number of times of occurrence L(y) of the 23-bit mantissa M of each difference signal sample Z is determined on a 1-byte basis, or if the integer formatting part 12 performs integer formatting by the modified rounding, the number of times of occurrence of each sample including the sign thereof is determined.

If the efficiency of the universal coding is estimated as described above, the processing load can be reduced compared to the case where the difference signal Z is universal-coded, the total number of bits of the resulting code within one frame is determined, and the analyzing and selecting part 134 selects one of the compressing parts. The use of such an efficiency estimation of the universal coding can be applied to the embodiment shown in FIG. 8.

In the above description, the samples in the signal sample sequence Y in the integer format have been 16-bit samples or 24-bit samples. However, the samples in the signal sample sequence Y may be composed of any number of bits equal to or less than 24, and based on the number of bits, the number of bits capable of assuming non-zero in each sample in the digital signal sample sequence Y in the integer format, which depends on the number of bits of each sample, can be determined. In this way, if the compression coding is performed on a divisional-unit basis, the number of bits to be converted into the integer format can be conveniently determined, and an auxiliary code that designates the number of bits can also be output.

Implementation by Computer

Figure 36:
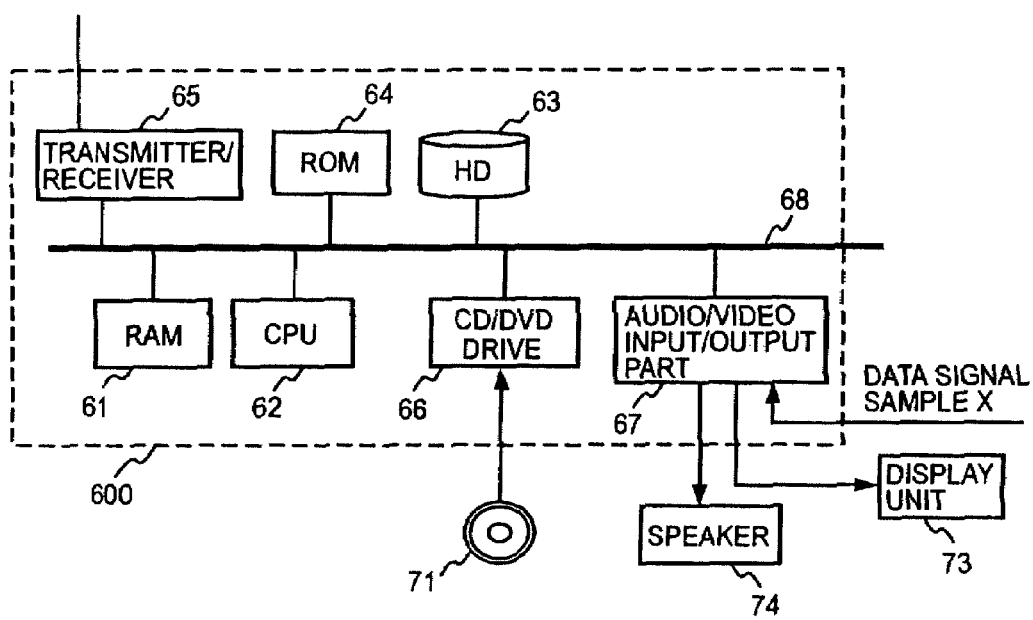
FIG. 36 shows a configuration of a computer on which the present invention is implemented.
Figure 37:
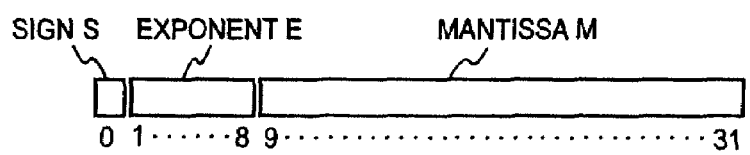
FIG. 37 shows a format of 32-bit floating point representation according to the IEEE-754.

As shown in FIG. 36, the coder shown in FIGS. 1, 8, 9, 11, 12, 16 and 35 can be implemented by a computer 600 comprising a RAM 61, a CPU 62, a hard disk 63, a ROM 64, a transmitter/receiver 65, an input/output part 66 and an audio/video input/output part 67, which are interconnected via a bus 68.

The ROM 64 stores a program for booting the computer, and the hard disk 63 stores an operating system program for the computer. A program for executing a function of the coder according to the present invention is previously read into the hard disk 63 from a recording medium 71, such as CD-ROM or DVD, via the CD/DVD drive 66, or previously downloaded to the hard disk 63 through a communication line and the transmitter/receiver 65.

The signal sample sequence X in the floating-point format to be coded is externally received at the audio/video input/output part 67, for example, and temporarily stored in the hard disk 63, which serves as a buffer. To start coding, a program for executing coding is read into the RAM 61 from the hard disk 63, and the program is executed by the CPU 62. Th result of coding, such as the codes Ca, Cb (or Z) and Cc, may be transmitted from the transmitter/receiver 65 to the outside via the communication line, or may be stored in a recording medium 65, such as CD and DVD, in the CD/DVD drive 66.

Similarly, in order to implement the decoder shown in FIGS. 7, 10, 11, 13 and 17 by the computer shown in FIG. 36, a program for executing a function of the decoder is stored in the hard disk 63, and a decoding program is executed on the codes Ca, Cb (or Z) and Cc received at the transmitter/receiver 65 through the communication line. The result of coding is output to a display unit 73 and a speaker 74 for reproduction.

The present invention can be applied not only to music signals but also to sound signals, image signals and the like.

What is claimed is:

1. A lossless coding method for a signal in a floating-point format, comprising:
    (a) a step of converting a first signal sample sequence in the floating-point format into a second signal sample sequence in an integer format;
    (b) a step of losslessly compressing said second signal sample sequence in the integer format to produce a first code sequence;
    (c) a step of producing a difference signal in the floating-point format that corresponds to the difference between said second signal sample sequence in the integer format and said first signal sample sequence in the floating-point format;
    (d) a step of determining which coding processing is of higher compression efficiency, a first coding processing that codes a bit sequence of digits capable of assuming non-zero values in each of samples of said difference signal in the floating-point format, the digits being determined by the absolute value of the corresponding sample in said second signal sample sequence in the integer format, or a second coding processing that codes all digits of said difference signal; and
    (e) a step of coding said difference signal by said first coding processing to produce a second code sequence if the result of said determination indicates said first coding processing, or coding said difference signal by said second coding processing to produce a second code sequence if the result of said determination indicates said second coding processing.

2. A lossless coding method for a signal in a floating-point format, comprising:
    (a) a step of determining, on a frame basis, which compression is of higher compression efficiency, a direct lossless compression of a first signal sample sequence in the floating-point format on a frame basis or a dual-signal separate compression of an integer-value sample sequence and a difference signal;
    (b) a step of performing the dual-signal separate compression if the result of said determination indicates the dual-signal separate compression, the step (b) comprising:
    (b-1) a step of converting the first signal sample sequence into a second signal sample sequence in an integer format;
    (b-2) a step of losslessly compressing said second signal sample sequence in the integer format to produce a first code sequence;
    (b-3) a step of producing a difference signal in the floating-point format that corresponds to the difference between said second signal sample sequence in the integer format and said first signal sample sequence in the floating-point format;
    (b-4) a step of producing a second code sequence from said difference signal in the floating-point format;
    (c) a step of directly losslessly compressing said first signal sample sequence to produce a third code sequence if the result of said determination indicates the direct lossless compression; and
    (d) a step of producing an auxiliary code that indicates whether said direct lossless compression or said dual-signal separate compression is performed,
    wherein, in said step (b-1), the conversion into said second signal sample sequence in the integer format is achieved by truncation of a fractional part, and said step (b-4) comprises:
- (b-4-1) a step of determining which coding processing is of higher compression efficiency, a first coding processing that codes a bit sequence of digits capable of assuming non-zero values in each of samples of said difference signal in the floating-point format, the digits being determined by the absolute value of the corresponding sample in said second signal sample sequence in the integer format, or a second coding processing that codes all digits of said difference signal; and
- (b-4-2) a step of coding said difference signal by said first coding processing to produce a second code sequence if the result of said determination indicates said first coding processing, or coding said difference signal by said second coding processing to produce a second code sequence if the result of said determination indicates said second coding processing.

3. A lossless coding method for a signal in a floating-point format according to claim 1 or 2, in which, in said first coding processing, bit sequences each containing digits capable of assuming non-zero values are losslessly compressed to produce said second code sequence, or bit sequences each containing digits capable of assuming non-zero values are output as said second code sequence without being processed.

4. A lossless coding method for a signal in a floating-point format according to claim 1 or 2, in which, in said second coding processing, a mantissa of said difference signal is losslessly compressed to produce said second code sequence, or said mantissa is output as said second code sequence without being processed.

5. A lossless coding method for a signal in a floating-point format according to claim 1 or 2, in which the bit length $b_1$ of each sample in said second signal sample sequence in the integer format is less than the number of bits $b_M$ of a mantissa of said first signal sample sequence in the floating-point format, and in said first coding processing, each bit sequence of digits capable of assuming non-zero values in the mantissa of each sample in said difference signal is divided into a higher-order sub-range containing a number of bits corresponding to the difference between the number of bits $b_M$ of said mantissa and the number of bits b1 of said each sample and a lower-order sub-range containing the remaining bits, the sub-ranges are separately losslessly compressed to produce respective code sequences, and said code sequences are combined and output as said second code sequence.

6. A lossless coding method for a signal in a floating-point format according to claim 1 or 2, in which said first coding processing is performed for each frame containing a plurality of samples and comprises a step of arranging factional parts, each of which is a range capable of assuming non-zero values in a mantissa of each difference signal samples in each frame with the most significant bits thereof or the least significant bits thereof aligned with each other, selecting a plurality of bits at least in the time-axis direction and/or the amplitude direction to produce a plurality of scanned bit sequences, and losslessly compressing said scanned bit sequences to produce said second code sequence.

7. A lossless coding method for a signal in a floating-point format according to claim 1 or 2, in which said first coding processing is performed for each frame containing a plurality of samples and comprises a step of arranging a bit sequence of digits capable of assuming non-zero values in each of difference signal samples in each frame and scanning the array of said bit sequence in a plurality of different predetermined scanning orders to produce respective scanned bit sequences, a step of coding said scanned bit sequences produced by scanning in said respective scanning orders to produce code sequences for the respective scanning orders, and a step of determining which scanning order provides the code sequence of the least quantity of information and outputting the determined code sequence as said second code sequence along with an auxiliary code that indicates the corresponding scanning order.

8. A lossless coding method for a signal in a floating-point format according to claim 1 or 2, in which said first coding processing comprises a step of determining, for each frame containing a plurality of samples, the average value of a sequence of integer-value samples, which correspond to the fractional parts of the difference signals in the relevant frame, performing prediction, in the time-axis direction, about signals resulting from subtraction of the average value from the value of each integer-value sample, losslessly compression-coding the prediction errors, and coding the average value to form said second code sequence.

9. A coding program that makes a computer execute each step of a lossless coding method for a digital signal in a floating-point format according to any one of claims 1 or 2.

10. A computer-readable recording medium that stores a program according to claim 1 or 2.

11. A lossless decoding method for a signal in a floating-point format, comprising:
- (a) a step of determining whether an input code sequence is a code sequence produced by a single-signal coding or a dual-signal coding, based on an input auxiliary code; and
- (b) if the result of said determination indicates the single-signal coding, a step of decoding and expanding an input code sequence as one code sequence to reproduce an original signal sample sequence in the floating-point format;
- (c) if the result of said determination indicates the dual-signal coding, a step of separating the input code sequence into a first code sequence and a second code sequence;
- (d) a step of decoding and expanding said first code sequence to produce a first signal sample sequence in an integer format;
- (e) a step of deriving a difference signal in the floating-point format from said second code sequence;
- (f) a step of converting said first signal sample sequence in the integer format into a second signal sample sequence in the floating-point format; and
- (g) a step of combining said second signal sample sequence in the floating-point format and said difference signal in the floating-point format to produce the original signal sample sequence in the floating-point format, wherein said step (e) comprises:
a step of determining which of a first expansion method and a second expansion method is used to decode and expand said second code sequence, based on said first signal sample sequence in the integer format or the input auxiliary code; and
a step of decoding and expanding said second code sequence into bit sequences each containing a number of digits capable of assuming non-zero values, the number of digits being uniquely determined by the absolute value of each sample of said first signal sample sequence, and assembling said difference signal from the bit sequences resulting from the decoding and expansion if the result of the determination indicates the first expansion method, or a step of directly decoding and expanding said second code sequence into said difference signal by the second expansion method if the result of the determination indicates the second expansion method.

12. A lossless decoding method for a signal in a floating-point format, comprising:
(a) a step of decoding and expanding a first code sequence to produce a first signal sample sequence in an integer format;
(b) a step of determining which of a first expansion method and a second expansion method is used to decode and expand a second code sequence, based on said first signal sample sequence or an auxiliary code;
(c) if the result of the determination indicates the first expansion method, a step of decoding and expanding said second code sequence into bit sequences each containing digits capable of assuming non-zero values, said digits being uniquely determined by the absolute value of the corresponding sample in said first signal sample sequence, and assembling the bit sequences resulting from the decoding and expansion into a difference signal in the floating-point format;
(d) if the result of the determination indicates the second expansion method, a step of producing all digits of a difference signal in the floating-point format from said second code sequence;
(e) a step of converting said first signal sample sequence in the integer format into a second signal sample sequence in the floating-point format; and
(f) a step of combining said first signal sample sequence in the floating-point format and said difference signal in the floating-point format to reproduce an original digital signal sequence in the floating-point format.

13. A lossless decoding method for a signal in a floating-point format according to claim 11 or 12, in which the step of producing said difference signal by said first expansion method comprises:
a step of decoding and expanding a first part of said second code sequence into a bit sequence containing digits capable of assuming non-zero values, said digits being uniquely determined by the absolute value of the corresponding sample in said first signal sample sequence in the integer format;
a step of decoding and expanding a second part of said second code sequence into a bit sequence containing a number of digits capable of assuming non-zero values, the number of digits being uniquely determined by the difference between the number of bits of the corresponding sample in said first signal sample sequence in the integer format and the number of bits of a mantissa of an original signal sample sequence in the floating-point format; and
a step of combining the bit sequence resulting from the decoding and expansion of the first part of the second code sequence and the bit sequence resulting from the decoding and expansion of the second part of the second code sequence to produce said difference signal.

14. A decoding program that makes a computer execute each step of a decoding method for a digital signal in a floating-point format according to any one of claims 11 or 12.

15. A computer-readable recording medium that stores a program according to claim 11 or 12.

16. A lossless coder for a signal in a floating-point format, comprising:
a first coding part that converts an input first signal sample sequence in the floating-point format into a second signal sample sequence in an integer format and losslessly compresses the second signal sample sequence;
a difference producing part that produces a difference signal in the floating-point format that corresponds to the difference between said second signal sample sequence in the integer format and said first signal sample in the floating-point format;
a second coding part that codes all digits of said difference signal in the floating-point format;
a third coding part that codes a bit sequence of digits capable of assuming non-zero values in each sample of said difference signal, said digits being determined by the absolute value of the corresponding sample in said signal sample sequence in the integer format; and
means for determining or estimating which of said second coding part and said third coding part provides higher compression efficiency, and selecting and outputting the code from the coding part determined or estimated to provide higher compression efficiency.

17. A decoder for a signal in a floating-point format, comprising:
a first expanding part that decodes and expands an input first code sequence to produce a first signal sample sequence in an integer format;
a second expanding part that decodes and expands an input second code sequence in a difference signal into a bit sequence containing digits capable of assuming non-zero values, said digits being determined by the absolute value of the corresponding sample in said first signal sample sequence in the integer format, and assembles the bits sequences resulting from the decoding and expansion into a difference signal in the floating-point format;
a third expanding part that directly decodes and expands said input second code sequence into all digits of said difference signal in the floating-point format;
a selecting part that selects one of said second expanding part and said third expanding part based on said first signal sample sequence or an input auxiliary code; and
a combining part that combines said first signal sample sequence in the floating-point format and said difference signal in the floating-point format received from the selected one of said second expanding part and the third expanding part to produce a third signal sample sequence in the floating-point format.

* * * * *